United States Patent
Tsuboi

(10) Patent No.: US 12,328,378 B2
(45) Date of Patent: Jun. 10, 2025

(54) SYNCHRONOUS CONTROL APPARATUS, SYNCHRONOUS IMAGING APPARATUS, SYNCHRONOUS CONTROL METHOD, AND STORAGE MEDIUM

(71) Applicant: CANON KABUSHIKI KAISHA, Tokyo (JP)

(72) Inventor: Satoru Tsuboi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 128 days.

(21) Appl. No.: 18/457,256

(22) Filed: Aug. 28, 2023

(65) Prior Publication Data

US 2024/0072990 A1    Feb. 29, 2024

(30) Foreign Application Priority Data

Aug. 31, 2022    (JP) ................. 2022-137746

(51) Int. Cl.
  *H04L 7/00*    (2006.01)
  *H03L 7/081*    (2006.01)

(52) U.S. Cl.
  CPC .......... *H04L 7/0008* (2013.01); *H03L 7/0816* (2013.01)

(58) Field of Classification Search
  CPC ....... H04L 7/0008; H03L 7/0816; G06F 1/14; H04J 3/0641; H04J 3/0667; H04J 3/14; H04N 5/04
  See application file for complete search history.

(56) References Cited

U.S. PATENT DOCUMENTS

| | | | | |
|---|---|---|---|---|
| 2006/0095703 | A1* | 5/2006 | Ferraiolo | G06F 13/4239 711/170 |
| 2010/0118721 | A1* | 5/2010 | Sakurada | H04L 12/422 370/252 |
| 2015/0326332 | A1* | 11/2015 | Chen | H04J 3/0658 370/503 |

FOREIGN PATENT DOCUMENTS

| JP | 2017211828 A | 11/2017 |
|---|---|---|
| JP | 2019158538 A | 9/2019 |

* cited by examiner

*Primary Examiner* — Sung S Ahn
(74) *Attorney, Agent, or Firm* — Canon U.S.A., Inc. IP Division

(57) ABSTRACT

A synchronous control apparatus includes an internal clock, a plurality of internal routes that are internal routes through which a synchronization packet passes as a part of a communication route and a transmission or reception time of the synchronization packet is acquired from the internal clock, and are internal routes provided in such a manner as to correspond to communication routes of a plurality of systems that are independent of each other, a synchronous control unit configured to synchronize the internal clock using the synchronization packet, a detection unit configured to detect abnormality of the communication route, a route control unit configured to, in a case where abnormality of the communication route has been detected, connect an internal route of a system in which abnormality has been detected to an internal route of a normal system.

9 Claims, 20 Drawing Sheets

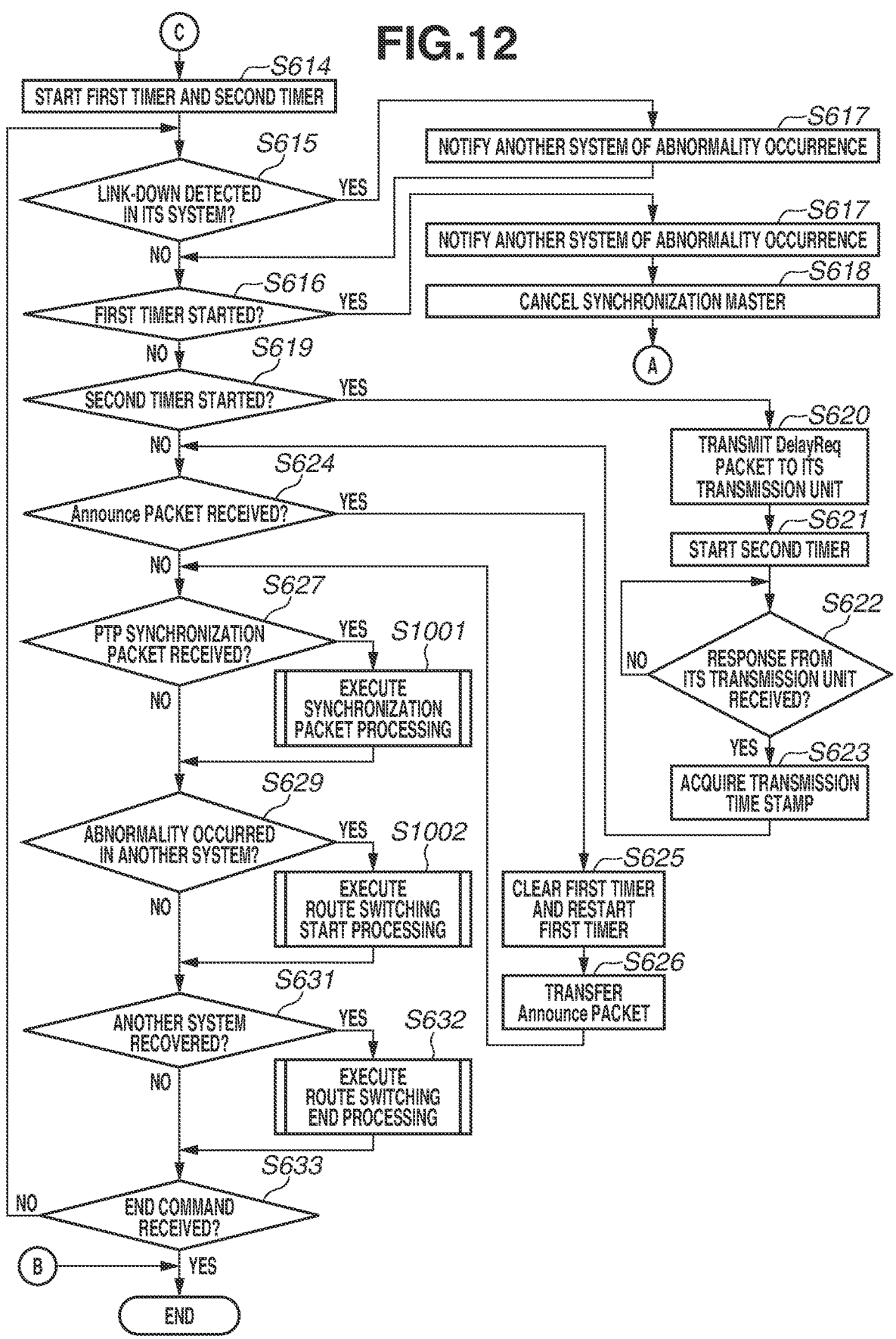

SYNCHRONOUS CONTROL APPARATUS, SYNCHRONOUS IMAGING APPARATUS, SYNCHRONOUS CONTROL METHOD, AND STORAGE MEDIUM

BACKGROUND

Field of the Disclosure

The present disclosure relates to a synchronous control apparatus, a synchronous imaging apparatus, a synchronous control method, and a storage medium.

Description of the Related Art

In recent years, attention has been paid to a technique of acquiring multi-view captured images by performing synchronous image capturing using, for example, a plurality of cameras installed at different positions, and generating virtual viewpoint content from the multi-view captured images. The improvement in synchronization accuracy has been demanded for the technique of synchronous control, which plays a key role in synchronous image capturing.

For example, Japanese Patent Application Laid-Open No. 2017-211828 discusses a technique of extracting image data of a predetermined region in captured images obtained by a plurality of cameras, and generating a virtual viewpoint image using the extracted image data. Japanese Patent Application Laid-Open No. 2017-211828 also discusses a method of synchronizing image capturing timings of the plurality of cameras. In addition, for example, Japanese Patent Application Laid-Open No. 2019-158538 discusses a boundary clock (BC) terminal having two independent synchronization routes, and a method of correcting a temporal difference statically arising between the routes in a case where abnormality occurs in one route, and changing a route of a synchronization packet.

Nevertheless, in a case where abnormalities occur in all of a plurality of synchronization routes (typically, both of two synchronization routes), the techniques discussed in Japanese Patent Application Laid-Open No. 2017-211828 and Japanese Patent Application Laid-Open No. 2019-158538 cannot maintain synchronization. Accordingly, there is a need to maintain synchronization even in a case where abnormalities occur in all of a plurality of synchronization routes.

SUMMARY

According to an aspect of the present disclosure, a synchronous control apparatus includes an internal clock, a plurality of internal routes that are internal routes through which a synchronization packet passes as a part of a communication route and a transmission or reception time of the synchronization packet is acquired from the internal clock, and are internal routes provided in such a manner as to correspond to communication routes of a plurality of systems that are independent of each other, a synchronous control unit configured to synchronize the internal clock using the synchronization packet, a detection unit configured to detect abnormality of the communication route, a route control unit configured to, in a case where abnormality of the communication route has been detected, connect an internal route of a system in which abnormality has been detected to an internal route of a normal system, and a holding calculation unit configured to calculate a holding time of a synchronization packet that is based on the transmission or reception time, for each route through which a synchronization packet passes, and add the holding time to a synchronization packet that passes through a same route as a route for which the holding time has been calculated.

Further features of the present disclosure will become apparent from the following description of exemplary embodiments with reference to the attached drawings.

BRIEF DESCRIPTION OF THE DRAWINGS

FIG. 12 is a flowchart illustrating time synchronization processing according to one or more aspects of the present disclosure.

DESCRIPTION OF THE EMBODIMENTS

Figure 1:
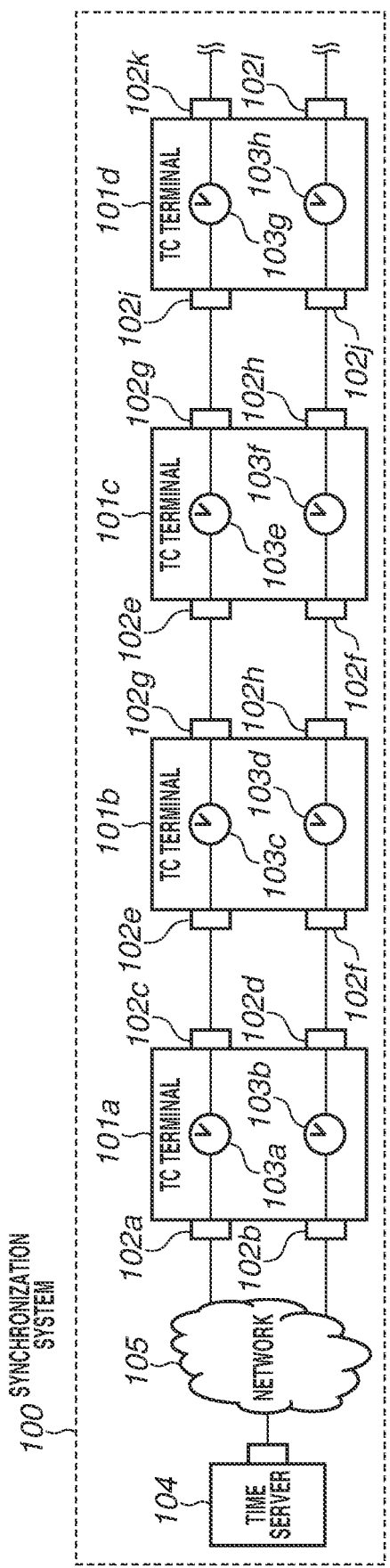
FIG. 1 is a conceptual configuration diagram conceptually illustrating a configuration of a synchronization system to which the present exemplary embodiment is applied.

Hereinafter, exemplary embodiments of the present disclosure will be described in detail with reference to the accompanying drawings. The following exemplary embodiments are not intended to limit the present disclosure. In addition, not all the combinations of features described in the exemplary embodiments are always essential to the solution of the present disclosure. The configurations of the exemplary embodiments can be appropriately modified or changed in accordance with the specifications and various conditions (e.g., usage conditions, and usage environments) of a system and an apparatus to which the present disclosure is applied. The technical scope of the present disclosure is defined by the appended claims, and are not to be defined by each of the following exemplary embodiments.

<Concept of Synchronization System>

Before exemplary embodiments of the present disclosure is described, the concept of a synchronization system presupposed by the exemplary embodiments will be described. In the synchronization system, daisy-chained terminals form a synchronization route. In addition, as synchronization routes, synchronization routes of a plurality of systems that are independent of each other (as an example, two systems corresponding to a system 0 and a system 1) are formed.

Each terminal in the synchronization system has a function of a precision time protocol (PTP) in the Institute of Electrical and Electronics Engineers (IEEE) 1588 standard, and executes synchronization by performing processing related to time synchronization, together with a time server. Hereinafter, a terminal including a clock serving as a reference clock in time synchronization will be referred to as a synchronization master, and a terminal to be synchronized with the reference clock will be referred to as a synchronization slave.

In the PTP, a boundary clock (hereinafter, abbreviated as "BC") and a transparent clock (hereinafter, abbreviated as "TC") are defined, and an establishment method and an operation method of a network in the synchronization system are also known. A BC terminal performs synchronization with a synchronization master, such as a grand master clock (hereinafter, referred to as a "GMC"), and further operates as a synchronization master. The separation and extension of the network in the synchronization system are thereby realized.

If a TC terminal receives a PTP packet from a synchronization master, such as the GMC, the TC terminal transfers the received PTP packet to a synchronization slave on a network downstream (hereinafter, will also simply be referred to as a "downstream") where only synchronization slaves exist. In addition, when the TC terminal transfers the PTP packet, the TC terminal calculates a time during which a synchronization packet is held in the TC terminal, and adds the calculated time to the PTP packet as a correction value. By using the holding time added to the PTP packet, the synchronization slave becomes able to execute time synchronization highly accurately. The TC terminal needs not execute time synchronization with the synchronization master, but if the TC terminal executes time synchronization, it becomes possible to further enhance synchronization accuracy as the entire system.

FIG. 1 is a conceptual configuration diagram conceptually illustrating a configuration of a synchronization system to which the present exemplary embodiment is applied.

A synchronization system 100 includes daisy-chained TC terminals 101a to 101d, and two independent synchronization routes (a route for the system 0 and a route for the system 1) are constructed by the TC terminals 101a to 101d. Each synchronization route in the synchronization system 100 is connected with a time server 104 via a network 105.

FIG. 1 illustrates four TC terminals 101a to 101d as an example, but the synchronization system 100 may further include another TC terminal on the downstream side.

In the following description, in a case where same type components to be distinguished from each other based on alphabets affixed to a reference numeral are collectively referred to, the reference numeral without any alphabet is sometimes used. For example, the four TC terminals 101a to 101d will sometimes be collectively referred to as TC terminals 101.

Each of the TC terminals 101 includes four communication interface (I/F) units 102. For example, the first TC terminal 101a includes four communication I/F units 102a, 102b, 102c, and 102d. Among the four communication I/F units 102a, 102b, 102c, and 102d, the first and third communication I/F units 102a and 102c belong to the route for the system 0. Then, the second and fourth communication I/F units 102b and 102d belong to the route for the system 1.

The TC terminal 101 transfers a synchronization packet for each synchronization route.

On the route for the system 0, a synchronization packet transmitted from the time server 104 operating as a synchronization master is received by the first communication I/F unit 102a of the first TC terminal 101a via the network 105. The first TC terminal 101a transfers the received synchronization packet to the third communication I/F unit 102c, and transmits the synchronization packet to the following TC terminals 101b to 101d.

In a similar manner, on the route for the system 1, a synchronization packet transmitted from the time server 104 is received by the second communication I/F unit 102b of the first TC terminal 101a via the network 105. The first TC terminal 101a transfers the received synchronization packet to the fourth communication I/F unit 102d, and transmits the synchronization packet to the following TC terminals 101b to 101d.

Each of the TC terminals 101 includes two clock units 103 as internal clocks. For example, the first TC terminal 101a includes a clock unit 103a of the system 0 and a clock unit 103b of the system 1, and the second TC terminal 101b includes a clock unit 103c of the system 0 and a clock unit 103d of the system 1.

For each of synchronization packets passing through the two synchronization routes, each of the TC terminals 101 calculates a holding time of a corresponding synchronization packet using the clock unit 103 of a corresponding system. The TC terminal 101 also operates as a synchronization slave, and performs time synchronization with the time server 104. Using two synchronization routes and concurrently synchronizing the two clock units 103 brings about such an advantage that, in a case where abnormality occurs in one route, a clock can be switched to another clock, and time synchronization can be maintained without deteriorating synchronization accuracy as a system.

Nevertheless, for example, a case where link-down of the route for the system 0 occurs between the first TC terminal 101a and the second TC terminal 101b, and, for example, link-down of the route for the system 1 occurs between the second TC terminal 101b and the third TC terminal 101c is assumed. In this case, if the route for the system 0 and the route for the system 1 are completely separated from each other, a synchronization packet stops being delivered to the fourth TC terminal 101d and a synchronization slave terminal on the downstream side of the fourth TC terminal 101d. Thus, synchronization cannot be maintained throughout the entire system.

Especially when daisy chain connection becomes longer, a synchronization route goes through a number of connection points, and thus a possibility that link-down occurs in any point from the upmost stream point to the downmost stream point of the synchronization route increases. Thus, a countermeasure to be taken assuming a case where link-down occurs on both of two synchronization routes is demanded. Hereinafter, an exemplary embodiment in which the countermeasure is taken will be described.

Figure 2:
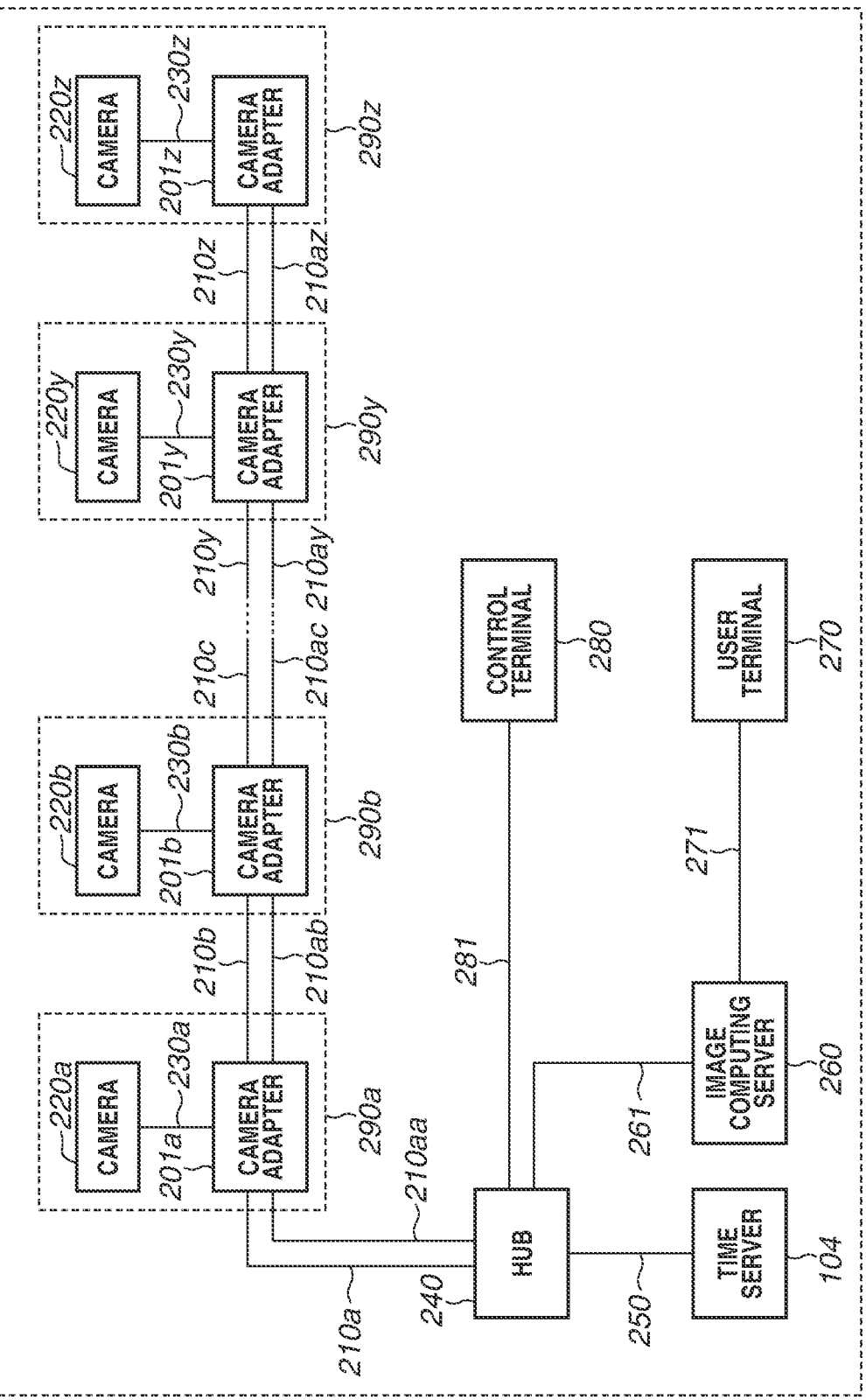
FIG. 2 is a system configuration diagram of a synchronous imaging system according to one or more aspects of the present disclosure.

FIG. 2 is a system configuration diagram of a synchronous imaging system according to the first exemplary embodiment.

A synchronous imaging system 200 is a system that performs image capturing by installing a plurality of cameras in a facility, such as a playing field (stadium) or a concert hall. The synchronous imaging system 200 includes sensor systems 290a to 290z, an image computing server 260, a user terminal 270, a control terminal 280, and a hub 240. A network is formed by these components of the synchronous imaging system 200.

The control terminal 280 performs operation state management and parameter setting control of each component of the synchronous imaging system 200 via the network. Here, the network can be the Gigabit Ethernet® (GbE), the 10 GbE, or the 100 GbE, which complies with an IEEE standard being the Ethernet®. Alternatively, the network can be formed by combining the InfiniBand being interconnection, and the industrial Ethernet®. The network is not limited to these, and a network of another type can be employed.

Each of the sensor systems 290 includes a camera 220 and a camera adapter 201. An image captured by the camera 220 is input to the image computing server 260 via the network. The image computing server 260 generates a virtual viewpoint image by processing the input image. The user terminal 270 is operated by the user. The user terminal 270 designates a viewpoint in the image computing server 260, and displays a virtual viewpoint image on a display screen.

The synchronous imaging system 200 includes 26 sets of sensor systems 290a to 290z as an example, but the number of the sensor systems is not limited to this. A plurality of sensor systems 290 need not have the same configuration, and can include apparatuses of different models, for example. In the present exemplary embodiment, the description will be given assuming that the word "image" includes both concepts of a moving image and a still image unless otherwise stated. That is, the synchronous imaging system 200 of the present exemplary embodiment can process both still images and moving images.

The sensor systems 290a to 290z included in the synchronous imaging system 200 are connected by the daisy chain, and the connection is duplexed. The daisy chain connection established by network cables from a first network cable 210a for the system 0 to a 26th network cable 210z for the system 0 forms the route for the system 0. The daisy chain connection established by network cables from a first network cable 210aa for the system 1 to a 26th network cable 210az for the system 1 forms the route for the system 1.

By using duplexed synchronization routes being formed by the daisy chain, it becomes possible to maintain synchronization in the synchronous imaging system 200 even if a failure occurs in one synchronization route.

FIG. 2 illustrates the configuration in which all of the 26 sensor systems 290a to 290z are daisy-chained, but a connection configuration in the synchronous imaging system 200 is not limited to this. For example, the plurality of sensor systems 290 can be divided into several groups, and sensor systems 290 can be daisy-chained for each divided group.

Such a configuration is effective especially in a stadium. For example, a case can be considered where a stadium includes a plurality of floors, and the daisy chain of sensor systems 290 is provided for each floor. In this case, input to the image computing server 260 can be performed for each floor or every half round of the stadium. Accordingly, the installation is simplified and the flexibility of the system is enhanced even in a location where it is difficult to carry out wiring for connecting all the sensor systems 290 by one daisy chain.

As described above, each of the sensor systems 290 includes the camera 220 and the camera adapter 201. In other words, the synchronous imaging system 200 includes a plurality of (e.g., 26) cameras 220 for capturing images of a subject from a plurality of directions. The plurality of cameras 220 included in the synchronous imaging system 200 can be different in performance or model.

In addition, the configuration of each of the sensor systems 290 is not limited to the configuration including the camera 220 and the camera adapter 201. For example, each of the sensor systems 290 can include an audio device, such as a microphone, and a camera platform for controlling the orientation of a camera. Alternatively, for example, the sensor system 290 can include one camera adapter 201 and a plurality of cameras 220, or can include one camera 220 and a plurality of camera adapters 201. That is, the synchronous imaging system 200 include one or a plurality of (N) cameras 220 and one or a plurality of (M) camera adapters 201 (N and M are integers larger than or equal to 1).

The camera 220 and the camera adapter 201 can be integrally formed. Furthermore, the image computing server 260 can include at least part of functions of the camera adapter 201. Hereinafter, the description will be given of an example case where each of the sensor systems 290 includes one camera 220 of the same model and one camera adapter 201.

<Generation of Virtual Viewpoint Image>

The camera adapter 201 of each of the sensor systems 290 transmits an image captured by the camera 220, to the image computing server 260 via daisy chain connection in the form of an image packet including image data. By using the connection configuration in which the sensor systems 290 are daisy-chained, it is possible to reduce the number of connection cables and achieve labor saving in wiring works when the capacity of image data gets large due to captured image resolution enhancement to 4K or 8K, and frame rate enhancement.

The control of image processing in the image computing server 260 is switched depending on whether the number of camera adapters 201 positioned at one end on the image computing server 260 side in daisy chain connection is one or a plural number. That is to say, the control in the image computing server 260 is switched depending on whether the sensor systems 290 is divided into a plurality of groups.

The camera adapter 201 at one end of the daisy chain connection relays an image from the camera adapter 201 of another daisy-chained sensor system 290, and inputs the image to the image computing server 260. In other words, the camera adapter 201 at one end of the daisy chain connection is the camera adapter 201 that performs image input to the image computing server 260 from the daisy chain connection.

In a case where the number of camera adapters 201 that perform image input is one, playing field entire circumference images are generated while images are being transmitted via the daisy chain connection. Thus, timings at which the entire circumference images are fully transmitted to the image computing server 260 are synchronized. That is to say, unless the sensor systems 290 are divided into groups, synchronization can be achieved.

Nevertheless, in a case where a plurality of camera adapters 201 that perform image input exist, a case can be considered where delay between image capturing and image input to the image computing server 260 varies for each lane (route) of daisy chain. That is, in a case where the sensor systems 290 are divided into groups, timings at which the entire circumference images are input to the image computing server 260 sometimes fail to be synchronized. It is thereby necessary to perform image processing while checking a collection state of images by performing synchronous control of executing synchronization waiting until the transmission of entire circumference image data in the image computing server 260 is completed.

For example, an image captured by the camera 220z of the 26th sensor system 290z is subjected to image processing in the camera adapter 201z. The processed image is transmitted to the camera adapter 201y of the 25th sensor system 290y via one of the network cable 210z for the system 0 of the daisy chain and the network cable 210az for the system 1 of the daisy chain. In a similar manner, the 25th sensor system 290y transmits a captured image to the neighboring sensor system 290x together with the image acquired from the 26th sensor system 290z.

By the above-described operation being executed in each of the sensor systems 290, images acquired by the respective sensor systems 290 are transmitted from the first sensor system 290a to the hub 240, and then transmitted to the image computing server 260.

The image computing server 260 performs processing of images captured by the sensor systems 290 and transmitted therefrom. The image computing server 260 first reconstructs a transmitted image packet, and converts a data format. Thereafter, the image computing server 260 stores an image in association with an identifier of the camera 220, a data type, and a frame number.

The image computing server 260 receives the designation of a viewpoint from the user terminal 270, reads out a corresponding image from stored information based on the designated viewpoint, and generates a virtual viewpoint image by performing rendering processing. The control terminal 280, the sensor systems 290, or the user terminal 270 can include at least part of the functions of the image computing server 260.

The virtual viewpoint image generated by rendering processing is transmitted to the user terminal 270 from the image computing server 260, and displayed on the display screen of the user terminal 270. The user who operates the user terminal 270 can browse an image at a viewpoint corresponding to the designation.

That is, the image computing server 260 generates virtual viewpoint content that is based on captured images (multi-view images) captured by a plurality of cameras 220, and viewpoint information.

In the present exemplary embodiment, the virtual viewpoint content is generated by the image computing server 260. However, the virtual viewpoint content can be generated by the control terminal 280 or the user terminal 270.

<Time Synchronization>

The time server 104 has a function of distributing a time, and distributes a time to the sensor systems 290 using a synchronization packet. The camera adapter 201 of each of the sensor systems 290 has a function equivalent to the above-described TC terminal 101. That is, the camera adapter 201 receives a synchronization packet in each of the duplexed daisy chains, and synchronizes an internal clock with the time server 104 based on time information included in the synchronization packet. The camera adapter 201 also performs image frame synchronization by synchronizing the camera 220 with the internal clock using a generator locking (Genlock) signal.

The camera adapter 201 transfers the received synchronization packet to the camera adapter 201 being a following terminal, and calculates a holding time of the synchronization packet in the terminal and adds the holding time to the synchronization packet when transferring the synchronization packet. All the camera adapters 201 included in the synchronous imaging system 200 can execute time synchronization highly accurately by having a function of executing time synchronization using a synchronization packet distributed by the time server 104, and a function of transferring the synchronization packet.

The camera adapters 201 time-synchronized based on the time server 104 become able to synchronize image capturing timings of the cameras 220. With this configuration, the synchronous imaging system 200 can generate a virtual viewpoint image based on a plurality of captured images captured at the same timing. It is accordingly possible to suppress quality deterioration of a virtual viewpoint image that is attributed to a difference in image capturing timing.

In preparation for the case where a failure occurs in the time server 104, redundancy can be obtained with a plurality of pieces of time servers 104 in the synchronous imaging system 200. In a case where redundancy is obtained, the time servers 104 are synchronized using a global positioning system (GPS) in such a manner that times are synchronized between the time servers 104.

<Hardware Configuration of Sensor System>

Figure 3:
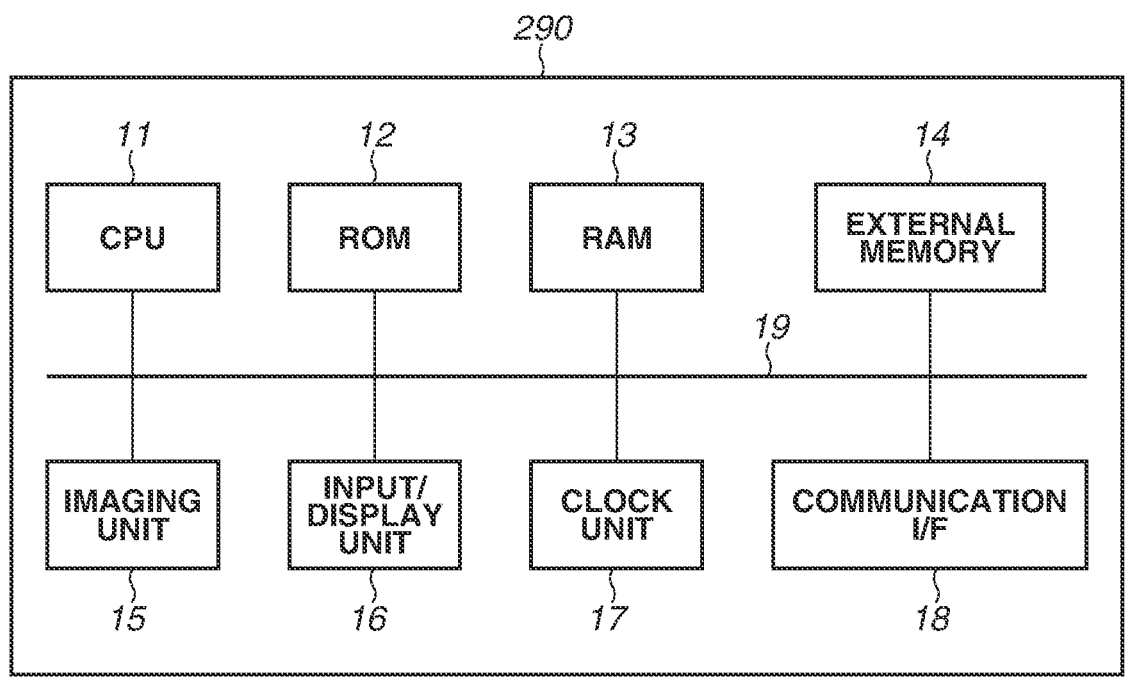
FIG. 3 is a hardware block diagram of a sensor system.

FIG. 3 is a hardware block diagram of the sensor system 290.

The sensor system 290 includes a central processing unit (CPU) 11, a read only memory (ROM) 12, and a random access memory (RAM) 13. The sensor system 290 also includes an external memory 14, an imaging unit 15, an input/display unit 16, a clock unit 17, and a communication I/F unit 18. These components are connected with each other via a bus 19.

The CPU 11 executes an application program or an operating system (OS) for operating the sensor system 290 as a synchronous control apparatus and a synchronous imaging apparatus. The ROM 12 stores a program (e.g., basic input/output system (BIOS)) for implementing basic functions of a computer. The RAM 13 stores programs and data that are to be used by the CPU 11. The external memory 14 stores application programs and data.

The imaging unit 15 functions as the above-described camera 220. The input/display unit 16 includes an input button and a graphical user interface (GUI). By the input/display unit 16 being operated by the user, an image capturing condition and the like are input to the sensor system 290, and image capturing information, captured images, and the like are displayed.

The clock unit 17 includes a quartz crystal device, and measures a time based on a character frequency. The communication I/F unit 18 performs transmission and reception of an image packet and a synchronization packet. FIG. 3 illustrates the communication I/F unit 18 as one block, but in the case of the present exemplary embodiment, for example, four communication I/F units 18 are included.

<Functional Configuration of Camera Adapter>

Figure 4:
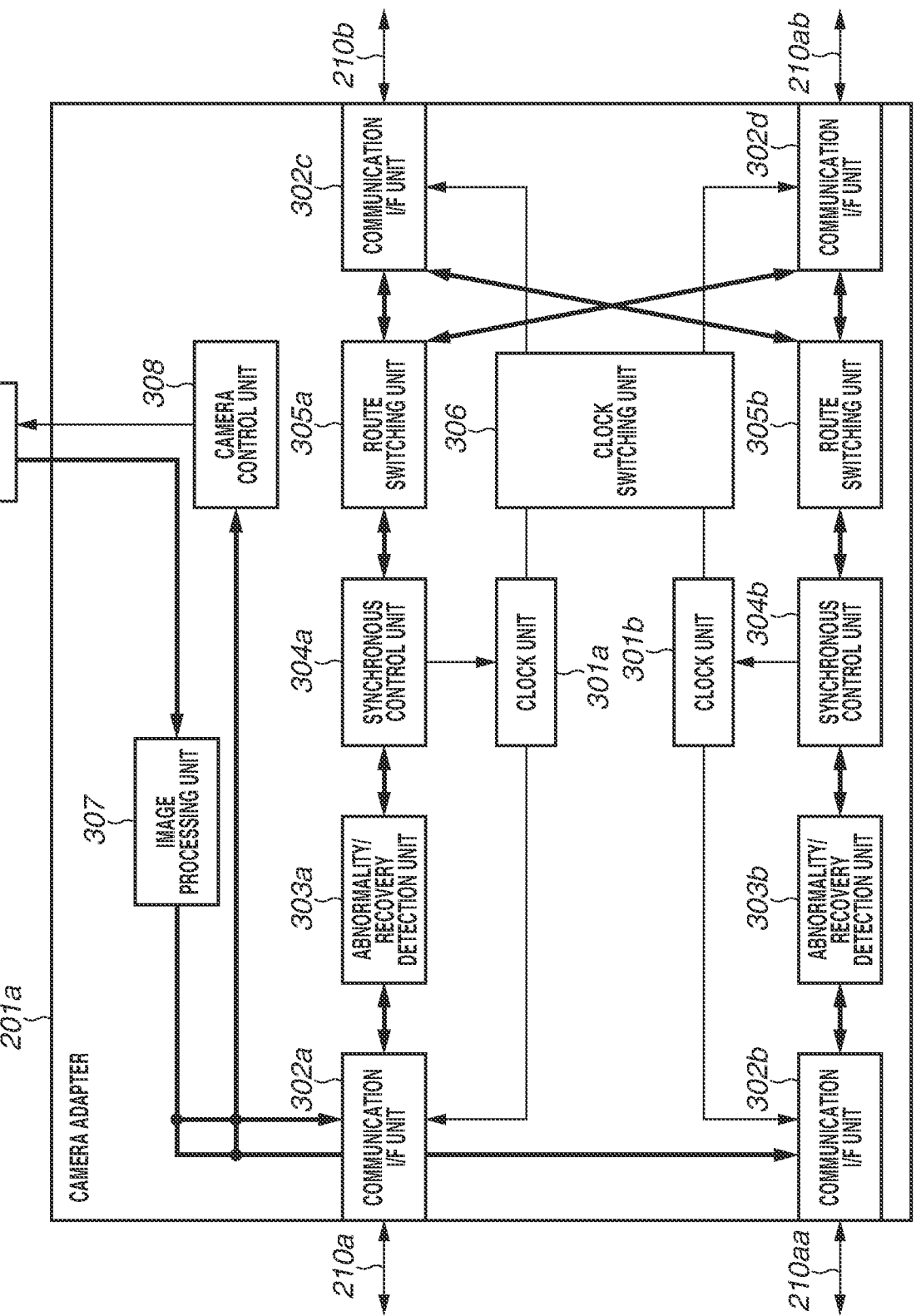
FIG. 4 is a functional block diagram illustrating functions of a camera adapter.

FIG. 4 is a functional block diagram illustrating functions of the camera adapter 201. FIG. 4 illustrates the first camera adapter 201a as a representative of the camera adapters 201.

The configuration illustrated in FIG. 4 is an example, and a plurality of functional blocks can form one functional block, or a certain functional block can be divided into blocks that perform a plurality of functions. Alternatively, at least one of the functional blocks can be implemented as hardware.

In a case where at least one of the functional blocks is implemented as hardware, it is sufficient that a dedicated circuit is automatically generated on a field programmable gate array (FPGA) from a program for implementing each step, by using a predetermined complier, for example.

At least one of the functional blocks can also be implemented as hardware by forming a gate array circuit similarly to the FPGA. Alternatively, an application specific integrated circuit (ASIC) can be used for the implementation.

The camera adapter 201*a* (201) includes clock units 301*a* and 301*b*, communication I/F units 302*a*, 302*b*, 302*c*, and 302*d*, abnormality/recovery detection units 303*a* and 303*b*, synchronous control units 304*a* and 304*b*, and route switching units 305*a* and 305*b*. The camera adapter 201 also includes a clock switching unit 306, an image processing unit 307, and a camera control unit 308.

Among the components of the camera adapter 201, the clock units 301, the communication I/F units 302, the abnormality/recovery detection units 303, the synchronous control units 304, and the route switching units 305 are duplexed with the route for the system 0 and the route for the system 1. That is, the clock unit 301*a*, the communication I/F units 302*a* and 302*c*, the abnormality/recovery detection unit 303*a*, the synchronous control unit 304*a*, and the route switching unit 305*a* belong to the route for the system 0. The clock unit 301*b*, the communication I/F units 302*b* and 302*d*, the abnormality/recovery detection unit 303*b*, the synchronous control unit 304*b*, and the route switching unit 305*b* belong to the route for the system 1.

The communication I/F units 302*a* and 302*c* belonging to the route for the system 0 are connected with each other by an internal route going through the abnormality/recovery detection unit 303*a*, the synchronous control unit 304*a*, and the route switching unit 305*a* belonging to the route for the system 0. In a similar manner, the communication I/F units 302*b* and 302*d* belonging to the route for the system 1 are connected with each other by an internal route going through the abnormality/recovery detection unit 303*b*, the synchronous control unit 304*b*, and the route switching unit 305*b* belonging to the route for the system 1.

A synchronization packet passes through each internal route of the camera adapter 201 as a part of a communication route serving as a synchronization route, and a transmission or reception time of the synchronization packet is acquired from the clock unit 301. The internal routes of the camera adapter 201 are provided in such a manner as to correspond to communication routes of a plurality of systems (e.g., the systems 0 and 1) that are independent of each other.

The clock unit 301 is a hardware clock (internal clock) that holds a current time, and counts up based on a clock signal output by a device such as a quartz-crystal clock. The clock unit 301 periodically outputs a reference signal (not illustrated) serving as a time reference in the camera adapter 201. The counted-up value (time stamp) is input to the communication I/F unit 302 and the clock switching unit 306.

The synchronous control unit 304 can adjust a frequency by increasing or decreasing a value to be counted up, by issuing an instruction to the clock unit 301. The synchronous control unit 304 can also directly change the value of the time stamp by adding a designated value to or subtracting a designated value from the value of the time stamp, by issuing an instruction to the clock unit 301.

A device such as a quartz-crystal clock always outputs a clock signal at a unique frequency. Not only a change in frequency is attributed to an environment change such as a temperature state or vibration, but also an individual difference in output frequency exists. That is to say, to realize high synchronization accuracy, it is not only necessary to increase or decrease the value of the time stamp at regular intervals, but also necessary to synchronize a progress degree of the time stamp with that of a synchronization master. Thus, the clock unit 301 is controlled by the synchronous control unit 304 in such a manner that the frequency is adjusted by an increase or a decrease in count up value, and is also synchronized with a frequency of the synchronization master.

The communication I/F unit 302 is connected with the neighboring camera adapter 201 and the hub 240 via the network cable 210. Furthermore, the communication I/F unit 302 performs transmission and reception of image capturing data, control data, and a communication packet for time synchronization with the time server 104, the image computing server 260, and the control terminal 280 via the hub 240.

To duplex the daisy chain, the camera adapter 201 includes at least four communication I/F units 302. Each of the communication I/F units 302 has functions of a physical layer and a data link layer of an Open Systems Interconnection (OSI) reference model, and stores a time stamp indicating a packet transmission or reception time. The time stamp is input to the communication I/F unit 302 from the clock unit 301 and the clock switching unit 306. The communication I/F unit 302 can store time stamps of a plurality of packets by having a buffer, such as a first in first out (FIFO) buffer.

The time stamp stored by the communication I/F unit 302 is added to a communication packet as auxiliary data in the camera adapter 201, and transmitted to the synchronous control unit 304.

A captured image obtained by the camera 220 is separated by the image processing unit 307 into a foreground image and a background image, and the foreground image and the background image are eventually transmitted to the image computing server 260 via the camera adapter 201 and the hub 240. By each of the camera adapters 201 outputting a foreground image and a background image, a virtual viewpoint image is generated by the image computing server 260 based on the foreground image and the background image captured from a plurality of viewpoints.

Some of the camera adapters 201 can output a foreground image separated from a captured image, and avoid outputting a background image. A captured image transmitted from another camera adapter 201 is received by the communication I/F unit 302, and output from another communication I/F unit 302 via a bridge portion (not illustrated). The communication I/F unit 302 to be used for the output is switched in accordance with the state of the camera adapter 201.

The abnormality/recovery detection unit 303 detects the link-down of the communication I/F unit 302, time out of a synchronization packet, and recovery thereof. That is, the abnormality/recovery detection unit 303 detects abnormality in a communication route serving as a synchronization route.

The abnormality/recovery detection unit 303*a* of the system 0 detects abnormality and recovery that occur in the synchronous control unit 304*a* of the system 0, together with the communication I/F unit 302*a* provided on the side where the time server 104 exists (i.e., provided on the upstream side), out of the communication I/F units 302*a* and 302*c* of the system 0. The abnormality/recovery detection unit 303*b* of the system 1 detects abnormality and recovery that occur in the synchronous control unit 304*b* of the system 1, together with the communication I/F unit 302*b* of the system 1 that exists on the upstream side.

Information regarding abnormality detection and recovery detection executed by the abnormality/recovery detection unit 303 is transmitted to the synchronous control unit 304 and the route switching unit 305, and is transmitted not only to its system but also to the other system. The abnormality/recovery detection unit 303 can be included in the communication I/F unit 302 or the synchronous control unit 304.

The synchronous control unit 304 performs protocol processing for executing time synchronization using a method complying with the IEEE 1588-2008 standard. The synchronous control unit 304 transmits a synchronization packet to or receives a synchronization packet from the time server 104, and synchronizes the clock unit 301 of its system with the time server 104. The synchronous control unit 304 is positioned at a midpoint on the above-described internal route. The synchronous control unit 304 synchronizes the clock unit 301 using a synchronization packet transmitted from the upstream side of the synchronization route.

The synchronous control unit 304 adjusts a time and a frequency of the clock unit 301 based on a difference between a time distributed by the time server 104 that is acquired from the synchronization packet, and a time indicated by the time stamp acquired from the communication I/F unit 302. The synchronous control unit 304 adjusts only the frequency when the difference is smaller than a threshold value. When transferring a synchronization packet, the synchronous control unit 304 measures a time during which the synchronization packet is held in the camera adapter 201, adds the measured time to a designated region of the synchronization packet, and transfers the synchronization packet. Consequently, it becomes possible to separate a time at which the synchronization packet passes through the network cable 210, and a time at which the synchronization packet passes through the inside of the camera adapter 201, and it becomes possible to execute time synchronization accurately.

As patterns of routes through which a communication packet related to synchronization communication passes within the camera adapter 201, 2×2 patterns in total exist. In the present exemplary embodiment, in a case where the abnormality/recovery detection unit 303 has not detected abnormality (i.e., in a normal state), a communication packet received by the communication I/F unit 302*a* of the system 0 that exists on the upstream side is transferred to the communication I/F unit 302*c* of the system 0 that exists on the downstream side. In addition, a communication packet received by the communication I/F unit 302*b* of the system 1 that exists on the upstream side is transferred to the communication I/F unit 302*d* of the system 1 that exists on the downstream side.

In other words, in the normal state, the synchronous control unit 304*a* of the system 0 uses the communication I/F unit 302*a* of the system 0 that exists on the upstream side, and uses the communication I/F unit 302*c* of the system 0 that exists on the downstream side, via the route switching unit 305*a* of the system 0. In a similar manner, in the normal state, the synchronous control unit 304*b* of the system 1 uses the communication I/F unit 302*b* of the system 1 that exists on the upstream side, and uses the communication I/F unit 302*d* of the system 1 that exists on the downstream side, via the route switching unit 305*b* of the system 1.

When the synchronous control unit 304 calculates a holding time, the synchronous control unit 304 calculates a holding time for each route in the camera adapter 201. A route through which a communication packet related to synchronization communication passes is switched only in a case where abnormality has been detected by the abnormality/recovery detection unit 303. Even in a case where the route is switched, the synchronous control unit 304 calculates a holding time for each route, and adds the calculated holding time to the communication packet passing through a corresponding route.

When a synchronization packet is received by the communication I/F unit 302, the synchronous control unit 304 acquires a time stamp indicating a time at which the synchronization packet is received, as auxiliary data of the received synchronization packet. When a synchronization packet is transmitted from the communication I/F unit 302, the synchronous control unit 304 acquires a time stamp included in the auxiliary data, via an error queue from the communication I/F unit 302 that has transmitted the synchronization packet. The error queue is a queue to be used when an error occurs in socket communication or the like, and is to be used for the reception and transmission of a time stamp at the time of transmission in the present exemplary embodiment. The time stamp is used in the calculation of a holding time.

In other words, the synchronous control unit 304 is an example of a holding calculation unit that calculates a holding time of a synchronization packet that is based on transmission and reception times, for each route through which the synchronization packet passes, and adds the holding time to any synchronization packet that passes through the same route as the route for which the holding time has been calculated.

A synchronization mechanism and a holding time will be described in detail with reference to a flowchart and a sequence diagram, which will be described below, together with processing of a synchronization packet.

The route switching unit 305 switches the communication I/F unit 302 to be used by the synchronous control unit 304 for the reception and transmission of a synchronization packet. In the normal state, the route switching unit 305 connects the communication I/F unit 302*a* or 302*b* of its system that exists on the upstream side, only to the communication I/F unit 302*c* or 302*d* of its system that exists on the downstream side. For example, the route switching unit 305*a* of the system 0 connects the communication I/F unit 302*a* of the system 0 that exists on the upstream side, only to the communication I/F unit 302*c* of the system 0 that exists on the downstream side.

In a case where an abnormality detection signal has been received from the abnormality/recovery detection unit 303 of the other system, the route switching unit 305 connects the communication I/F unit 302*a* or 302*b* existing on the upstream side, also to the communication I/F unit 302*c* or 302*d* of the other system that exists on the downstream side. For example, in a case where an abnormality detection signal has been received from the abnormality/recovery detection unit 303*b* of the system 1, the route switching unit 305*a* of the system 0 connects the communication I/F unit 302*a* of the system 0 that exists on the upstream side, also to the communication I/F unit 302*d* of the system 1 that exists on the downstream side.

That is, the route switching unit 305 is an example of a route control unit that connects, in a case where abnormality of a communication route has been detected, an internal route of a system in which the abnormality has been detected, to an internal route of a normal system. In the present exemplary embodiment, the route switching unit 305 controls an internal route existing on the downstream side of the synchronous control unit 304.

In addition, if the route switching unit 305 receives recovery information from the abnormality/recovery detection unit 303 of the other system after receiving abnormality detection, the route switching unit 305 reconnects the communication I/F unit 302a or 302b of its system that exists on the upstream side, only to the communication I/F unit 302c or 302d of its system that exists on the downstream side. For example, if the route switching unit 305a of the system 0 receives recovery information from the system 1, the route switching unit 305a reconnects the communication I/F unit 302a of the system 0 that exists on the upstream side, only to the communication I/F unit 302c of the system 0 that exists on the downstream side.

A state in which abnormality is detected by the abnormality/recovery detection unit 303 of the camera adapter 201 is a state in which the synchronous control unit 304 cannot receive a synchronization packet from the communication I/F unit 302. If this state is left, a synchronization packet stops being supplied to a system in which abnormality has been detected. Then, among two clock units 301 included in the camera adapter 201 existing on the downstream side, the clock unit 301 of the system in which abnormality has been detected enters a state of being unable to synchronize with the time server 104.

If abnormality is further detected in this state by the abnormality/recovery detection unit 303 of the other system in the camera adapter 201 existing on the downstream side, a synchronization packet also stops being supplied to the other system. Thus, each of the camera adapters 201 existing on a further downstream side becomes totally unable to execute time synchronization with the time server 104.

In view of the foregoing, in the present exemplary embodiment, the route switching unit 305 of a normal system of the camera adapter 201 also adds, as a route of a synchronization packet, a route connecting to the communication I/F unit 302 existing on the downstream side of a system in which abnormality has been detected. Consequently, a synchronization packet received by the communication I/F unit 302 through the daisy chain of the normal system goes through the synchronous control unit 304 of the normal system, and then transmitted to the camera adapter 201 existing on the downstream side, from the communication I/F unit 302 of the both systems.

Accordingly, in each of the camera adapters 201 existing on the downstream side, synchronization between the clock units 301 is maintained by both of the two synchronous control units 304. Furthermore, the maintenance of high synchronization accuracy can be realized by the synchronous control unit 304 of a normal system individually managing, controlling, and calculating a holding time generated in each route of a synchronization packet, due to route switching. The functions of the route switching unit 305 can be included in the synchronous control unit 304 or the communication I/F unit 302.

The clock switching unit 306 switches the communication I/F unit 302 to which a time stamp output by the clock unit 301 is to be input.

In the normal state, a time stamp output by each of the clock units 301 is input to the communication I/F unit 302 of its system. More specifically, a time stamp output by the clock unit 301a of the system 0 is input to the communication I/F unit 302c of the system 0, and a time stamp output by the clock unit 301b of the system 1 is input to the communication I/F unit 302d of the system 1.

In a case where abnormality has been detected by the abnormality/recovery detection unit 303, a time stamp output by the clock unit 301 of a normal system is input to the communication I/F units 302 of both systems. For example, if abnormality is detected in the system 0, a time stamp output by the clock unit 301b of the system 1 is input to the communication I/F units 302c and 302d of both systems. That is to say, as for an internal route of a system in which abnormality of a communication route has been detected, a time is provided from the clock unit 301 of a normal system.

If recovery is detected by the abnormality/recovery detection unit 303, a time stamp output by each of the clock units 301 is input again to the communication I/F unit 302 of its system.

By using the switching processing executed by the clock switching unit 306, the communication I/F units 302c and 302d of both systems become able to always acquire a time stamp synchronized with a synchronization master.

The image processing unit 307 has the following functions as functions of image processing on image data obtained by image capturing executed by the camera 220.

The image processing unit 307 has a function of separating image data obtained by image capturing executed by the camera 220, into a foreground image and a background image. That is, each of the camera adapters 201 operates as an image processing apparatus that extracts a predetermined region from an image captured by a corresponding camera 220. For example, the predetermined region is a foreground image obtained as a result of object detection executed on a captured image, and by the extraction, the image processing unit 307 separates the captured image into a foreground image and a background image.

The object is a person, for example. Nevertheless, the object can be a specific person (e.g., player, manager, and/or referee), or can be an object of which an image pattern is predefined, such as a ball or a goal. A moving object can be detected as an object. The foreground image and the background image are eventually transmitted to the image computing server 260.

By separately processing a foreground image including an important object such as a person, and a background image not including such an object, a portion of a virtual viewpoint image generated by the synchronous imaging system 200 that corresponds to the above-described object improves in image quality.

By each of the camera adapters 201 performing separation into a foreground image and a background image, load in the synchronous imaging system 200 including a plurality of cameras 220 can be distributed. The predetermined region is not limited to a foreground image, and can be a background image, for example.

The image processing unit 307 has a function of generating image information related to a three-dimensional model, using, for example, the principle of a stereo camera by utilizing the separated foreground image and a foreground image received from another camera adapter 201.

The image processing unit 307 has a function of acquiring image data for calibration to be performed by the image computing server 260, from the camera 220 via the camera control unit 308, and transmitting the image data to the image computing server 260. The calibration in the present exemplary embodiment is processing of associating parameters related to a plurality of cameras 220, with each other, and achieving consistency. As the calibration, for example, processing of adjusting world coordinate systems held by the installed cameras 220, in such a manner as to be identical, and color correction processing for reducing color non-uniformity between the cameras 220 are performed.

Specific processing to be executed as the calibration is not limited to this. In the present exemplary embodiment, calculation processing related to calibration is performed by the image computing server 260, but a node at which calculation processing is performed is not limited to the image computing server 260. For example, calculation processing can be performed at another node, such as the control terminal 280 or the camera adapter 201.

The image processing unit 307 has a function of performing calibration during image capturing (dynamic calibration) in accordance with a preset parameter, on image data acquired from the camera 220 via the camera control unit 308.

The camera control unit 308 connects with the camera 220, and performs control of the camera 220, captured image acquisition, synchronization signal provision, and time setting. The control of the camera 220 includes, for example, the setting and reference of an image capturing parameter (e.g., settings of the number of pixels, color depth, frame rate, and white balance). The control of the camera 220 also includes the acquisition of the state of the camera 220 (e.g., image capturing state, stopped state, synchronizing state, and error), start and stop of image capturing, and focus adjustment.

In the present exemplary embodiment, focus adjustment is performed via the camera 220, but in a case where a removable lens is attached to the camera 220, the camera adapter 201 can connect to the lens and directly adjust the lens. Alternatively, the camera adapter 201 can perform lens adjustment via the camera 220.

In the synchronization signal provision, a time and a reference signal provided from the clock unit 301 synchronized with the time server 104 are used, and a control clock indicating an image capturing timing is provided to the camera 220.

In the time setting, a time synchronized with the time server 104 is provided as a time code complying with the SMPTE12M format, for example. The time code is thereby added to image data received from the camera 220. The format of the time code is not limited to the SMPTE12M, and another format can be used.

Figure 5:
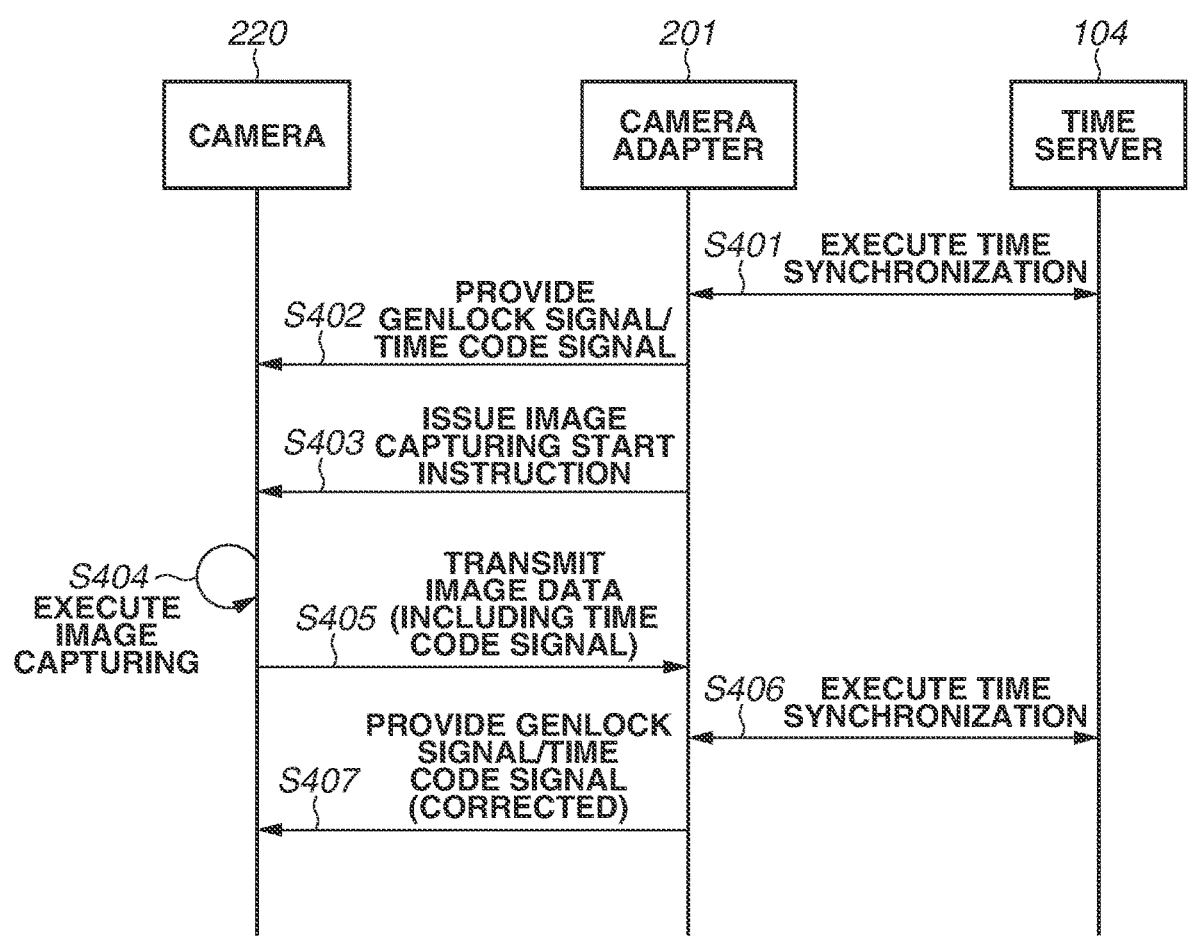
FIG. 5 is a sequence diagram illustrating image capturing start processing.

Image capturing start processing to be executed by the camera 220 will now be described. FIG. 5 is a sequence diagram illustrating image capturing start processing.

The camera adapter 201 performs communication with the time server 104 using a method complying with the IEEE 1588-2008 standard (PTP version2, hereinafter abbreviated as "PTPv2"). In step S401, the camera adapter 201 corrects a time to be managed by the clock unit 301 serving as an internal clock, and performs time synchronization with the time server 104.

At this time, in step S402, the camera adapter 201 starts to provide, to the camera 220, a synchronous image capturing signal and a time code signal, such as a Genlock signal and a tri-level synchronization signal, in synchronization with an image capturing frame. Information to be provided is not limited to the time code, and another type of information can be provided as long as the information includes an identifier for making an image capturing frame identifiable.

In step S403, the camera adapter 201 issues an image capturing start instruction to the camera 220. Time synchronization between the time server 104 and a plurality of camera adapters 201 has been achieved, start timings of the cameras 220 can be synchronized. If, in step S404, the camera 220 receives the image capturing start instruction the camera 220 performs image capturing in synchronization with the Genlock signal.

In step S405, the camera 220 transmits a captured image including a time code signal, to the camera adapter 201. Image capturing synchronized with the Genlock signal is performed until the camera 220 stops the image capturing. In step S406, the camera adapter 201 performs time synchronization with the time server 104 by performing PTP time correction processing during image capturing, and in step S407, the camera adapter 201 corrects a generation timing of the Genlock signal. In a case where a necessary correction amount becomes large, correction suitable for a preset change amount can be applied.

By using the sequence illustrated in FIG. 5, synchronous image capturing is implemented by a plurality of cameras 220 connected to a plurality of camera adapters 201 in the synchronous imaging system 200. FIG. 5 illustrates an image capturing start processing sequence of the camera 220. In a case where a microphone exists, synchronous sound collection is performed by performing processing similar to the synchronous image capturing executed by the camera 220.

<Time Synchronization Sequence>

A time synchronization sequence to be executed between the time server 104 and the camera adapter 201 in compliance with the PTPv2 will now be described.

Figure 6:
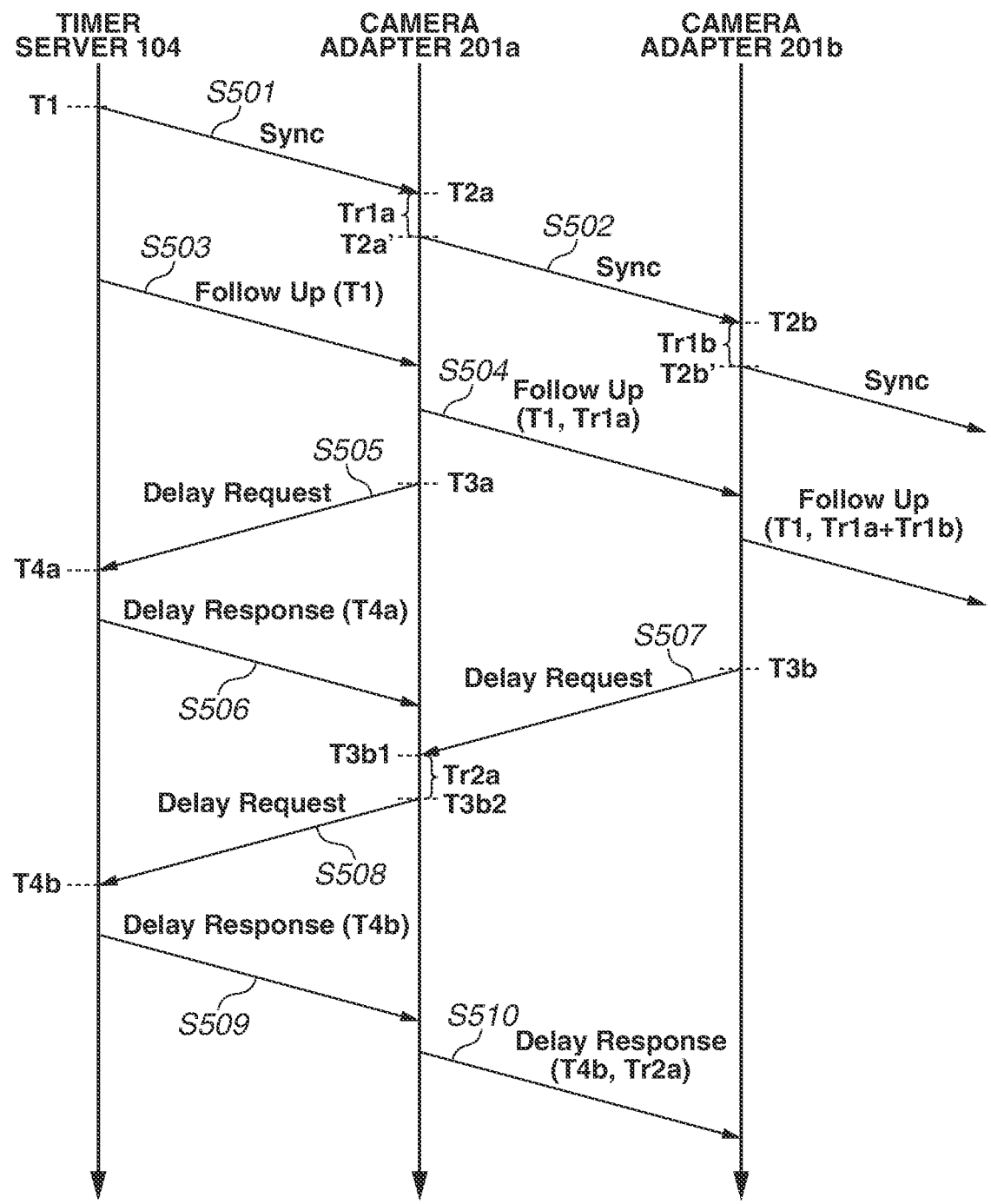
FIG. 6 is a sequence diagram illustrating a time synchronization sequence.

FIG. 6 is a sequence diagram illustrating a time synchronization sequence. In the sequence illustrated in FIG. 6, a Sync packet, a Follow Up packet, a Delay Request (Delay Req) packet, and a Delay Response (Delay Resp) packet are used as synchronization packets.

In the sequence illustrated in FIG. 6, an example case where a transmission method of a synchronization packet is multicast transmission is illustrated, but a transmission method of a synchronization packet is not limited to the multicast transmission.

FIG. 6 illustrates, as an example, a sequence executed by the time server 104, the first camera adapter 201*a*, and the second camera adapter 201*b*.

In step S501, the time server 104 transmits a Sync packet. The time server 104 holds a transmission time T1. The first camera adapter 201*a* that has received the Sync packet holds a reception time T2a.

In step S502, the first camera adapter 201*a* transfers the Sync packet received in step S501, and also holds a transmission time T2a' of the transferred Sync packet. The second camera adapter 201*b* that has received the Sync packet transferred from the first camera adapter 201*a* holds a reception time T2b similarly to the first camera adapter 201*a*. The second camera adapter 201*b* then transfers the Sync packet, and holds a transmission time T2b'.

In step S503, the time server 104 transmits a Follow Up packet including information regarding the transmission time T1 held in step S501.

In step S504, the first camera adapter 201*a* that has received the Follow Up packet acquires the transmission time T1 included in the Follow Up packet, and calculates a holding time (Tr1a) of the Sync packet from the held reception time T2a and the transmission time T2a' using the following formula.

$$\text{Holding time (Sync)} = T2a' - T2a = Tr1a$$

The first camera adapter 201*a* adds the calculated holding time Tr1a to a predetermined region in the Follow Up packet, and transfers the Follow Up packet. After the Follow Up packet is transferred, calculation in time synchronization is performed, but the processing is skipped because information required for performing calculation of time synchronization is insufficient at the time point of step S504. This is because a delay time of a return path has not been calculated yet although the holding time Tr1a indicating a delay time of an outward path has been calculated.

The second camera adapter 201b that has received the Follow Up packet transferred from the first camera adapter 201a also performs similar processing. If the holding time calculated by the second camera adapter 201b is denoted by Tr1b, a value to be calculated by the second camera adapter 201b to the predetermined region when the Follow Up packet is transferred is represented as Tr1a+Tr1b.

In step S505, the first camera adapter 201a transmits a Delay Req packet to the time server 104, and holds a transmission time Tia. The time server 104 that has received the Delay Req packet holds a reception time T4a.

In step S506, the time server 104 transmits a Delay Resp packet to the first camera adapter 201a being a transmission source of the Delay Req packet received in step S505. The Delay Resp packet includes information regarding the reception time T4a of the Delay Req packet that has been held in step S505.

The first camera adapter 201a that has received the Delay Resp packet acquires the information regarding the reception time T4a that is included in the Delay Resp packet, and further acquires a sum of holding times of Delay Req packets. The first camera adapter 201a is adjacent to the time server 104, and thus the sum of holding times of Delay Req packets is 0.

In step S507, similarly to step S505, the second camera adapter 201b transmits a Delay Req packet to the first camera adapter 201a, and holds a transmission time T3b.

In step S508, the first camera adapter 201a that has received the Delay Req packet transfers the Delay Req packet to the time server 104. Similarly to the time of the Sync packet, the first camera adapter 201a holds a reception time T3b1 and a transmission time T3b2 of the Delay Req packet when transferring the Delay Req packet. The time server 104 that has received the Delay Req packet holds a reception time T4b.

In step S509, similarly to step S506, the time server 104 transmits a Delay Resp packet to the first camera adapter 201a being a transmission source of the Delay Req packet received in step S508. The Delay Resp packet includes information regarding the reception time T4b of the Delay Req packet that has been held in step S508.

In step S510, the first camera adapter 201a that has received the Delay Resp packet checks a transmission destination of the Delay Resp packet and confirms that the Delay Resp packet is not addressed to itself. Then, the first camera adapter 201a calculates a holding time Tr2a of the Delay Req packet corresponding to the transmission destination using the following formula, adds the calculated holding time Tr2a to a predetermined region of the Delay Resp packet, and transfers the Delay Resp packet.

$$\text{Holding time (Delay Req)} = T3b2 - T3b1 = Tr2a$$

In step S510, the second camera adapter 201b receives the Delay Resp packet addressed to itself, and acquires information regarding the reception time T4b and the holding time (Tr2a) of the Delay Req packet that are included in the Delay Resp packet. For the sake of convenience of illustration, FIG. 6 only illustrates one round from a Sync packet to a Delay Resp packet, but the sequence illustrated in FIG. 6 is repeatedly executed.

As a result, the transmission and reception times (T1 to T4b) and the holding times (Tr1a to Tr2a) are acquired, and time synchronization becomes executable as described below. The time server 104 transmits Sync packet at regular intervals, and transmits a Follow Up packet immediately after transmitting the Sync packet.

A calculation method in time synchronization will now be described using the second camera adapter 201b as an example.

An average transmission path delay between the time server 104 serving as a synchronization master and the camera adapter 201b serving as a synchronization slave is obtained by the following formula.

$$\text{Average transmission path delay} = \{(T4b-T1)-(T3b-T2b)-(Tr1a+Tr2a)\}/2$$

In addition, by using the average transmission path delay and the holding time of the Sync packet, a time correction amount (offset) from the time server 104 serving as a synchronization master is obtained by the following formula.

$$\text{Time correction amount} = T2b - T1 - \text{average transmission path delay} - Tr1a$$

If the average transmission path delay and the correction amount are converted into general formulae, the following general formulae are obtained.

$$\text{Average transmission path delay} = \{(\text{Delay Req reception time} - \text{Sync transmission time})(\text{Delay Req transmission time} - \text{Sync reception time}) - (\text{sum of Sync holding times} + \text{sum of Delay Req holding times})\}/2$$

$$\text{Time correction amount} = \text{Sync reception time} - \text{Sync transmission time} - \text{average transmission path delay} - \text{sum of Sync holding times or sum of Delay Req holding times}$$

Furthermore, if a time at which the time server 104 transmits a second Sync packet is denoted by T5, and a time at which the second camera adapter 201b receives the Sync packet is denoted by T6b, a frequency correction amount is obtained by the following formulas.

$$\text{Frequency correction amount} = (Fo-Fr)/Fr$$

$$Fr = 1/(T5-T1)$$

$$Fo = 1/(T6b-T2b)$$

By the above-described calculation formulae, each of the camera adapters 201 becomes able to synchronize with a time of the time server 104 serving as a synchronization master, and a frequency thereof.

In the sequence illustrated in FIG. 6, an example of a time synchronization method including two steps (two types corresponding to a Sync packet and a Follow Up packet are used) is illustrated. However, a time synchronization method can only include one step (a Follow Up packet is not transmitted). In the case of one step, a Sync transmission time (T1) of the time server 104 is attached to the Sync packet. In addition, a holding time (Tr1a, Tr1b, ...) of a Sync packet that has been calculated by the camera adapter 201 is added to the Sync packet. The calculation in time synchronization is then performed after the Sync packet is transferred.

In this specification, four types corresponding to a Sync packet, a Follow Up packet, a Delay Req packet, and a Delay Resp packet are defined as PTP synchronization packets for the sake of convenience.

A terminal that has generated a PTP synchronization packet adds an ID of itself to a predetermined field of the PTP synchronization packet, and transmits the PTP synchronization packet. A terminal that receives the PTP synchronization packet becomes able to provide appropriate information in accordance with the added ID.

For example, in the first camera adapter 201a, Delay Req packets transmitted by the second camera adapter 201b and the third camera adapter 201c include their added Identifications (IDs). The first camera adapter 201a can accordingly calculate and hold a holding time of the Delay Req packet in accordance with an ID.

In addition, for example, the time server 104 serving as a synchronization master needs to transmit the Delay Req reception time T4a and T4b to each synchronization slave. Accordingly, when the time server 104 receives a Delay Req packet, the time server 104 holds not only the reception times T4a and T4b but also simultaneously holds an ID included in the Delay Req packet, and performs association.

When a Delay Resp packet is transmitted, a synchronization slave becomes possible to determine whether the Delay Resp packet is addressed to itself by adding together the reception times T4a and T4b of the Delay Req packet and an ID of a destination synchronization slave, to the Delay Resp packet. As an ID, a Port Identity of the PTPTv2 can be used, or another type of information can be used.

The camera adapter 201 includes two synchronous control units 304, and therefore two sequences illustrated in FIG. 6 independently operate concurrently. In the sequence, the time server 104 transmits an Announce packet at regular intervals, which is not illustrated. The Announce packet is used for a synchronization slave determining a synchronization master, and for determining whether the determined synchronization master is operating on a synchronization network.

Next, time synchronization processing to be executed by the camera adapter 201 to implement the above-described time synchronization sequence will be described.

Figure 7:
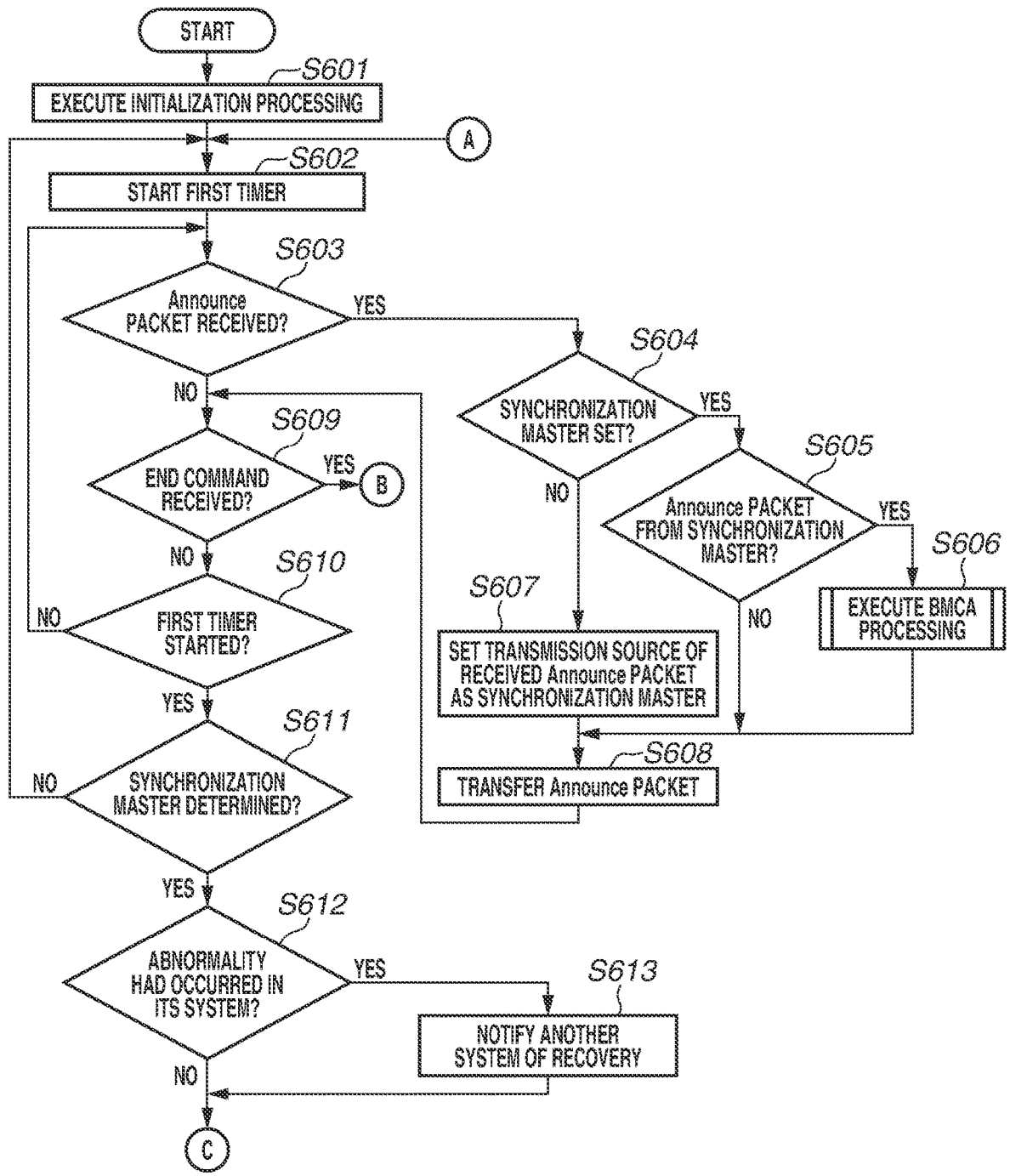
FIG. 7 is a flowchart illustrating an anterior half part of time synchronization processing to be executed by a camera adapter.
Figure 8:
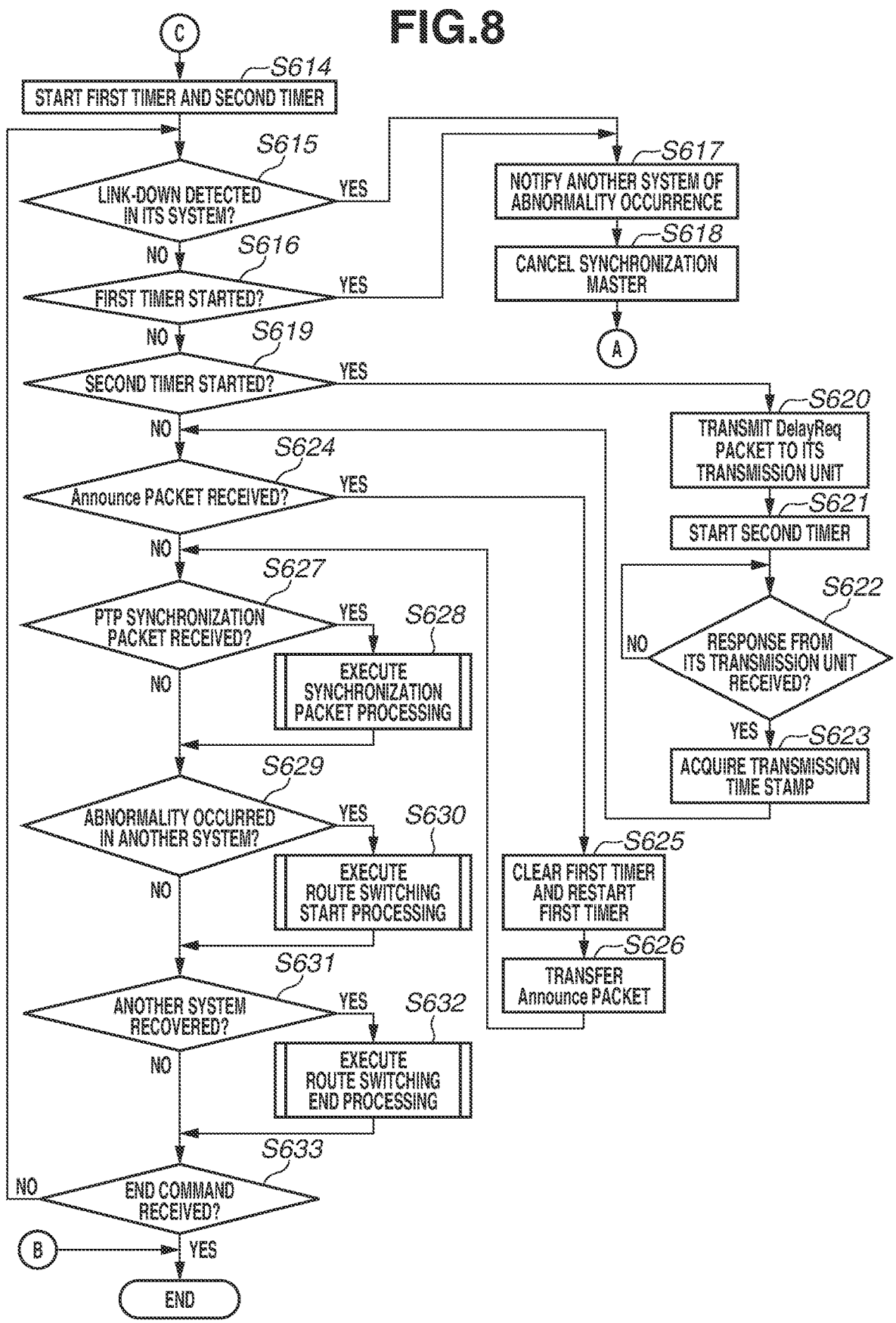
FIG. 8 is a flowchart illustrating a posterior half part of the time synchronization processing to be executed by the camera adapter.

FIGS. 7 and 8 are flowcharts illustrating time synchronization processing to be executed by the camera adapter 201. Points indicated by A, B, and C illustrated in FIG. 7 respectively connect to points indicated by A, B, and C illustrated in FIG. 8.

The time synchronization processing illustrated in the flowcharts in FIGS. 7 and 8 is started by a time synchronization program being automatically activated if the power of the camera adapter 201 is turned on. In addition, also in a case where the time synchronization processing ends and the time synchronization program is activated again, the time synchronization processing illustrated in the flowcharts in FIGS. 7 and 8 is started. The time synchronization processing illustrated in FIGS. 7 and 8 can be started in accordance with an instruction issued by the control terminal 280.

Two pieces of time synchronization processing illustrated in FIGS. 7 and 8 are concurrently operated by one camera adapter 201. That is, time synchronization processing on the route for the system 0 and time synchronization processing on the route for the system 1 are operated. In the time synchronization processing on the route for the system 0, its system refers to the route for the system 0, and the other system refers to the route for the system 1. In the time synchronization processing on the route for the system 1, its system refers to the route for the system 1, and the other system refers to the route for the system 0.

In step S601, initialization processing for implementing time synchronization of the system is performed. The initialization processing includes the register setting of the communication I/F unit 302 to be used in the time synchronization processing. In the initialization processing, setting values of various timers to be used in the time synchronization processing are determined, and information regarding the time server 104 serving as a synchronization master to which the camera adapter 201 is to be synchronized is reset.

In step S602, a first timer is started, and the processing proceeds to step S603.

In step S603, it is determined whether the Announce packet of the PTPv2 has been received. In a case where it is determined in step S603 that the Announce packet has been received (YES in step S603), the processing proceeds to step S604. In step S604, it is determined whether a synchronization master is set.

In a case where it is determined in step S604 that a synchronization master is set (YES in step S604), the processing proceeds to step S605. In step S605, it is determined whether the Announce packet received in step S603 is an Announce packet from the synchronization master. In a case where it is determined in step S605 that the received Announce packet is an Announce packet from the synchronization master (YES in step S605), the processing proceeds to step S606. In step S606, Best Master Clock Algorithm (hereinafter, abbreviated as BMCA) processing is performed.

The BMCA processing is defined in the PTPv2, and is an algorithm of determining a synchronization master to which a corresponding apparatus is to be synchronized, by using priority information or accuracy information included in the Announce packet. By all the camera adapters 201 using the same algorithm, a synchronization master to which the camera adapters 201 are synchronized are unified. In a case where it is determined, as a result, of the BMCA processing that an Announce packet has been received from a better synchronization master, the setting of a synchronization master is updated.

If the BMCA processing ends in step S606, the processing proceeds to step S608. In step S608, the Announce packet is transferred to the communication I/F unit 302 other than the communication I/F unit 302 that has received the Announce packet, and the processing proceeds to step S609. In the normal state in which the abnormality/recovery detection unit 303 has not detected abnormality, the transfer executed in step S608 becomes transfer to the communication I/F unit 302 of its system that exists on the downstream side, via the route switching unit 305 of its system. In contrast, in the abnormal state when the abnormality/recovery detection unit 303 detects abnormality, the transfer executed in step S608 becomes transfer to the communication I/F units 302c and 302d of the both systems that exist on the downstream side, via the route switching unit 305 of its system.

In a case where it is determined in step S605 described above that the received Announce packet is an Announce packet from a terminal other than the synchronization master (NO in step S605), the processing in step S606 is skipped and the processing proceeds to step S608.

In a case where it is determined in step S604 described above that a synchronization master is not set (NO in step S604), the processing proceeds to step S607. In step S607, a transmission source of the received Announce packet (initially-set synchronization master) is set as a synchronization master, and the processing proceeds to step S608.

In a case where it is determined in step S603 described above that the Announce packet has not been received (NO in step S603), the processing in steps S604 to S608 is skipped, and the processing proceeds to step S609.

In step S609, it is determined whether an end command has been received. In a case where the end command has been received (YES in step S609), the time synchronization processing ends, and if the time synchronization program is activated again, the time synchronization processing starts from step S601. In a case where it is determined in step S609 that the end command has not been received (NO in step S609), the processing proceeds to step S610. In step S610, it is determined whether the first timer has been started. In a case where the first timer has not been started (NO in step S610), the processing returns to step S603. In a case where the first timer has been started (YES in step S610), the processing proceeds to step S611.

In step S611, it is determined whether a synchronization master has been determined. In a case where a synchronization master has not been determined (NO in step S611), the processing returns to step S602. In a case where a synchronization master has been determined (YES in step S611), the processing proceeds to step S612. In step S612, it is determined whether abnormality has occurred in its system. In a case where abnormality has occurred (YES in step S612), the processing proceeds to step S613. In step S613, the other system is notified of recovery from the abnormality, and the processing proceeds to step S614. In a case where abnormality has not occurred (NO in step S612), the processing in step S613 is skipped, and the processing proceeds to step S614.

In step S614, the first timer and a second timer are started, and the processing proceeds to step S615.

In step S615, it is determined whether link-down has been detected in its system. In step S616, it is determined whether the first timer has been started.

In a case where it is determined in step S615 that link-down has been detected (YES in step S615), or in a case where it is determined in step S616 that the first timer has been started (YES in step S616), the processing proceeds to step S617. In step S617, the other system is notified of abnormality occurrence, and the processing proceeds to step S618. In step S618, a synchronization master with which a corresponding terminal is currently synchronized is canceled, and the processing returns to step S602.

In a case where it is determined in step S615 that link-down has not been detected (NO in step S615), and in a case where it is determined in step S616 that the first timer has not been started (NO in step S616), the processing proceeds to step S619. In step S619, it is determined whether the second timer has been started. In a case where the second timer has been started (YES in step S619), the processing proceeds to step S620. In step S620, a Delay Req packet is transmitted to the synchronization master from the communication I/F unit 302 existing on the upstream side, and the processing proceeds to step S621. In the transmission of the Delay Req packet, the communication I/F unit 302a of the system 0 is used if the time synchronization processing is executed on the route for the system 0, and the communication I/F unit 302b of the system 1 is used if the time synchronization processing is executed on the route for the system 1.

In step S621, the second timer is started, and the processing proceeds to step S622.

In step S622, a standby state is caused until a response of an error queue is received from the communication I/F unit 302 used in step S620. In a case where the response has been received (YES in step S622), the processing proceeds to step S623.

In step S623, a transmission time stamp added to the error queue as auxiliary data is held, and the processing proceeds to step S624.

In a case where it is determined in step S619 described above that the second timer has not been started (NO in step S619), the processing in steps S620 to S623 is skipped, and the processing proceeds to step S624.

In step S624, it is determined whether the Announce packet has been received. In a case where the Announce packet has been received (YES in step S624), the processing proceeds to step S625. In step S625, the first timer is cleared, and the first timer is restarted, and then the processing proceeds to step S626.

In step S626, similarly to step S608, the Announce packet is transferred and the processing proceeds to step S627.

In a case where it is determined in step S624 described above that the Announce packet has not been received (NO in step S624), the processing in steps S625 and S626 is skipped, and the processing proceeds to step S627.

In step S627, it is determined whether a PTP synchronization packet has been received. In a case where the PTP synchronization packet has been received (YES in step S627), the processing proceeds to step S628. In step S628, synchronization packet processing is performed on the received PTP synchronization packet, and the processing proceeds to step S629. The synchronization packet processing will be described below. In a case where the PTP synchronization packet has not been received (NO in step S627), the processing in step S628 is skipped, and the processing proceeds to step S629.

In step S629, it is determined whether abnormality has occurred in the other system. In a case where abnormality has occurred (YES in step S629), the processing proceeds to step S630. In step S630, route switching start processing is performed, and the processing proceeds to step S631. In a case where abnormality has not occurred in the other system (NO in step S629), the processing in step S630 is skipped, and the processing proceeds to step S631.

The route switching start processing in step S630 will be described using an example in which abnormality has occurred in the system 0. If abnormality occurs in the system 0, in the time synchronization processing on the route for the system 0, a synchronization packet and an Announce packet are not delivered from the communication I/F unit 302a of the system 0 that exist on the upstream side. Thus, until resynchronization is achieved with the synchronization master, the clock unit 301a of the system 0 stays in a self-operated state.

In the time synchronization processing on the route for the system 1 that has received a notification indicating abnormality occurrence, by the time synchronization processing on the route for the system 0, the route switching unit 305b of the system 1 is notified of abnormality detection. The synchronous control unit 304b of the system 1 are then connected with the communication I/F units 302c and 302d of both the system 0 and the system 1 via the route switching unit 305b.

Furthermore, the synchronous control unit 304b of the system 1 controls the clock switching unit 306 in such a manner that a time stamp output from the clock unit 301b of the system 1 is input to the communication I/F units 302c and 302d of both the system 0 and the system 1.

By the above-described processing being performed in step S630, a synchronization packet received by the communication I/F unit 302*b* of the system 1 that exists on the upstream side is transferred to the communication I/F units 302*c* and 302*d* of both the system 0 and the system 1.

Also in a case where abnormality is detected by the abnormality/recovery detection unit 303*b* of the system 1, a synchronization packet received by the communication I/F unit 302*a* of the system 0 that exists on the upstream side is transferred to the communication I/F units 302*c* and 302*d* of both the system 0 and the system 1, by processing similar to the above-described processing being performed in step S630.

In step S631, it is determined whether the other system has recovered. In a case where the other system has recovered (YES in step S631), the processing proceeds to step S632. In step S632, the route switching end processing is performed, and the processing proceeds to step S633. In a case where the other system has not recovered (NO in step S631), the processing in step S632 is skipped, and the processing proceeds to step S633.

The route switching end processing in step S632 will be described using an example case where recovery is detected by the abnormality/recovery detection unit 303*a* of the system 0. In the time synchronization processing on the route for the system 0, a synchronization packet and an Announce packet restart to be delivered from the communication I/F unit 302*a* of the system 0 that exists on the upstream side, and thus resynchronization with the synchronization master becomes executable.

In the time synchronization processing on the route for the system 1 that has received a recovery notification by the time synchronization processing on the route for the system 0, the route switching unit 305*b* of the system 1 is notified of recovery. The route switching unit 305*b* of the system 1 that has received the notification cancels connection with the communication I/F unit 302*c* of the system 0.

Furthermore, the synchronous control unit 304*b* of the system 1 controls the clock switching unit 306 in such a manner that a time stamp output from the clock unit 301*a* of the system 0 is input only to the communication I/F unit 302*c* of the system 0.

By the above-described processing being performed in step S632, the state returns to the normal state that has been caused before abnormality occurs. Also in a case where recovery is detected by the abnormality/recovery detection unit 303*b* of the system 1, by similar processing being performed in step S632, the state returns to the normal state that has been caused before abnormality occurs.

In step S633, it is determined whether the end command has been received. In a case where the end command has been received (YES in step S633), the time synchronization processing ends. In a case where the end command has not been received (NO in step S633), the processing returns to S615.

The synchronization packet processing in step S628 will now be described. The synchronization packet processing is processing varying between the normal state and an abnormal state.

Figure 9A:
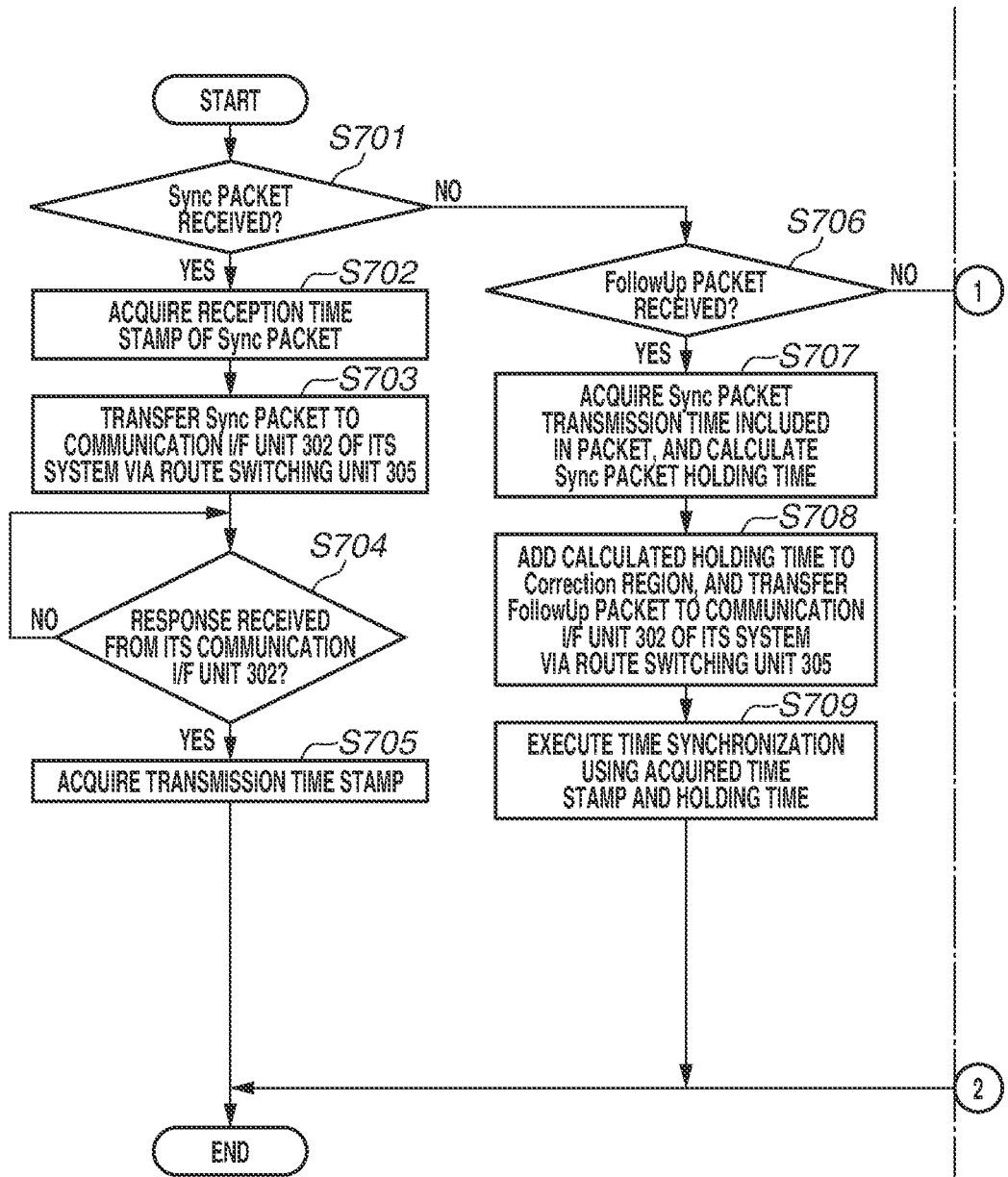
FIGS. 9A and 9B illustrate a flowchart of synchronization packet processing to be executed in a normal state.
Figure 9B:
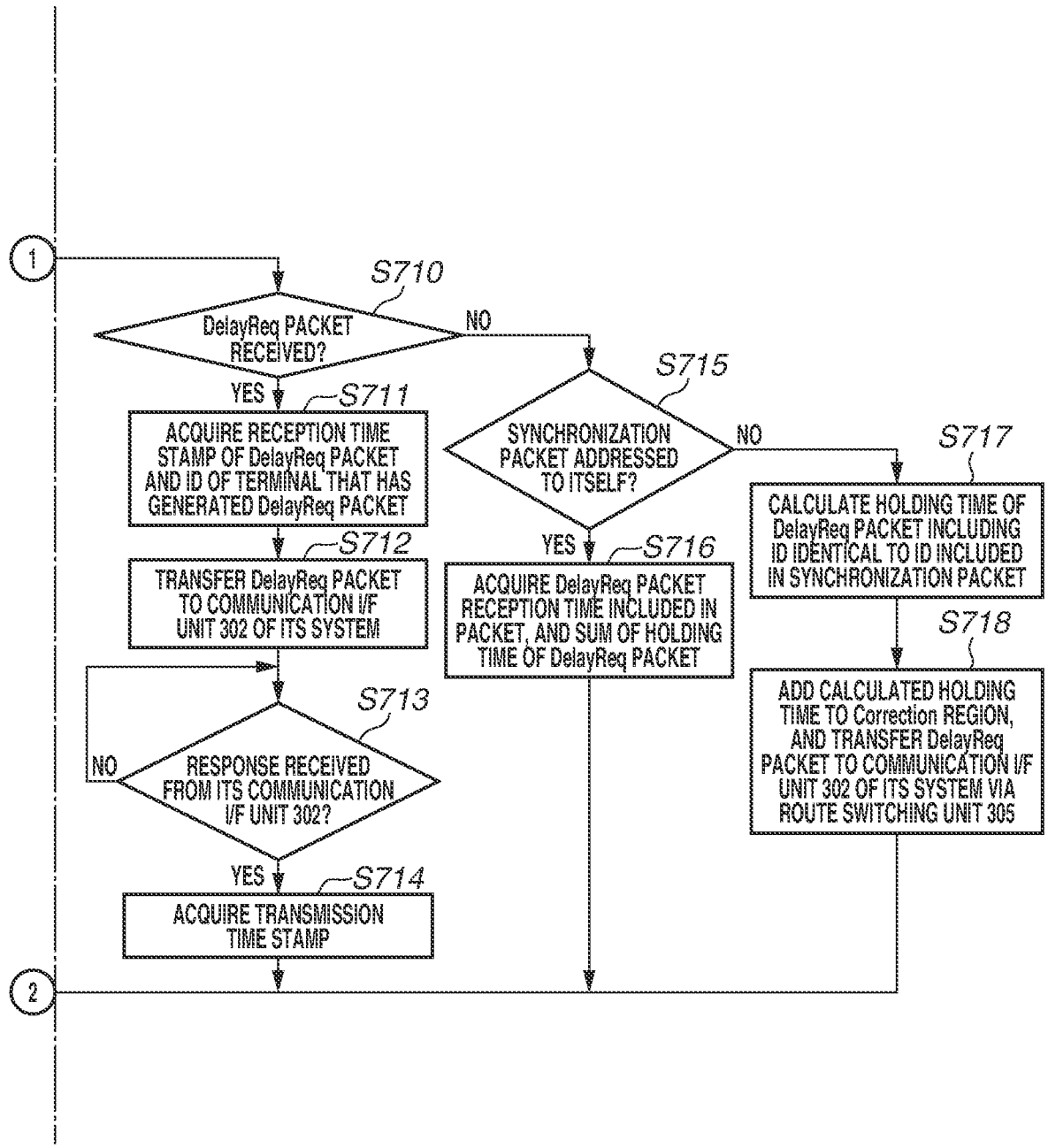

FIGS. 9A and 9B illustrate a flowchart of synchronization packet processing to be executed in the normal state.

In step S701, it is determined whether the received PTP synchronization packet is a Sync packet. In a case where the received PTP synchronization packet is a Sync packet (YES in step S701), the processing proceeds to step S702.

In step S702, a reception time stamp added to the Sync packet as auxiliary data is acquired, and the processing proceeds to step S703.

In step S703, the received Sync packet is transferred to the communication I/F unit 302 of its system via the route switching unit 305, and the processing proceeds to step S704. For example, in the case of the time synchronization processing on the route for the system 0, a Sync packet is transferred to the communication I/F unit 302*c* of the system 0 that exists on the downstream side.

In step S704, a standby state is caused until a response of an error queue is received from the communication I/F unit 302 used in step S703 for transfer, and in a case where the response has been received (YES in step S704), the processing proceeds to step S705.

In step S705, a transmission time stamp added as auxiliary data to the error queue received in step S704 is acquired, and the synchronization packet processing is ended.

In a case where it is determined in step S701 described above that the received PTP synchronization packet is not a Sync packet (NO in step S701), the processing proceeds to step S706. In step S706, it is determined whether the received PTP synchronization packet is a Follow Up packet. In a case where the received PTP synchronization packet is a Follow Up packet (YES in step S706), the processing proceeds to S707. In step S707, a transmission time of the Sync packet that is included in the Follow Up packet is acquired and held. Thereafter, a holding time of the Sync packet is calculated from a difference between the reception time stamp acquired in step S702 and the transmission time stamp acquired in step S705, and the processing proceeds to step S708.

In step S708, the holding time calculated in step S707 is added to a Correction region of the Follow Up packet, and a sum of holding times is acquired and held. Similarly to step S703, the Follow Up packet is transferred to the communication I/F unit 302 via the route switching unit 305. After the transfer, the processing proceeds to step S709.

In step S709, time synchronization is executed using the transmission time of the Sync packet that has been held in step S707, and a sum of holding times of the Sync packet that has been held in step S708. Thereafter, the synchronization packet processing is ended.

In a case where it is determined in step S706 described above that the received PTP synchronization packet is not a Follow Up packet (NO in step S706), the processing proceeds to step S710. In step S710, it is determined whether the received synchronization packet is a Delay Req packet. In a case where the received synchronization packet is a Delay Req packet (YES in step S706), the processing proceeds to step S711. In step S711, a reception time stamp added to the Delay Req packet as an auxiliary data is acquired. Also in step S711, an ID of a terminal (i.e., the camera adapter 201) that has generated the Delay Req packet that is included in the received Delay Req packet is acquired. The acquired reception time stamp and the ID are held in association with each other, and the processing proceeds to step S712.

In step S712, the received Delay Req packet is transferred to the communication I/F unit 302 of its system. For example, in the case of the time synchronization processing on the route for the system 0, the received Delay Req packet is transferred to the communication I/F unit 302*a* of the system 0 that exists on the upstream side. After the transfer, the processing proceeds to step S713. In step S713, a standby state is caused until a response of an error queue is received from the communication I/F unit 302 used for transfer in step S712, and in a case where the response has been received (YES in step S713), the processing proceeds to step S714.

In step S714, a transmission time stamp added as auxiliary data to the error queue received in step S713 is acquired, and the synchronization packet processing is ended. Similarly to step S711, the acquired transmission time stamp is held in association with the ID of the terminal that has generated the Delay Req packet.

In a case where it is determined in step S710 described above that the received synchronization packet is not a Delay Req packet (NO in step S710), the processing proceeds to step S715. In step S715, it is determined whether the synchronization packet is addressed to itself. In a case where the synchronization packet is addressed to itself (YES in step S715), the processing proceeds to step S716. In step S716, a reception time of a Delay Req packet of the synchronization master and a sum of holding times of the Delay Req packet are acquired from the received synchronization packet (i.e., Delay Resp packet addressed to itself). The acquired information is to be used in time synchronization calculation in step S709. After step S716, the synchronization packet processing is ended.

In a case where it is determined in step S715 described above that the synchronization packet is not addressed to itself (NO in step S715), the processing proceeds to step S717. In step S717, a reception time stamp and a transmission time stamp held in association with the ID included in the Delay Resp packet are acquired, and a holding time of the Delay Req packet is calculated. After that, the processing proceeds to step S718. In step S718, the holding time calculated in step S717 is added to a Correction region of the Delay Resp packet. Similarly to step S703, the Delay Resp packet is transferred to the communication I/F unit 302 via the route switching unit 305.

The calculation timing of the holding time is not limited to the calculation timing in the above-described example, and can be immediately after the transmission time stamp of the Sync packet or the transmission time stamp of the Delay Req packet is acquired. In addition, the above description, a holding time is calculated when the Follow Up packet and the Delay Resp packet are received, but the holding time can be calculated when the Sync packet and the Delay Req packet are transmitted.

Figure 10A:
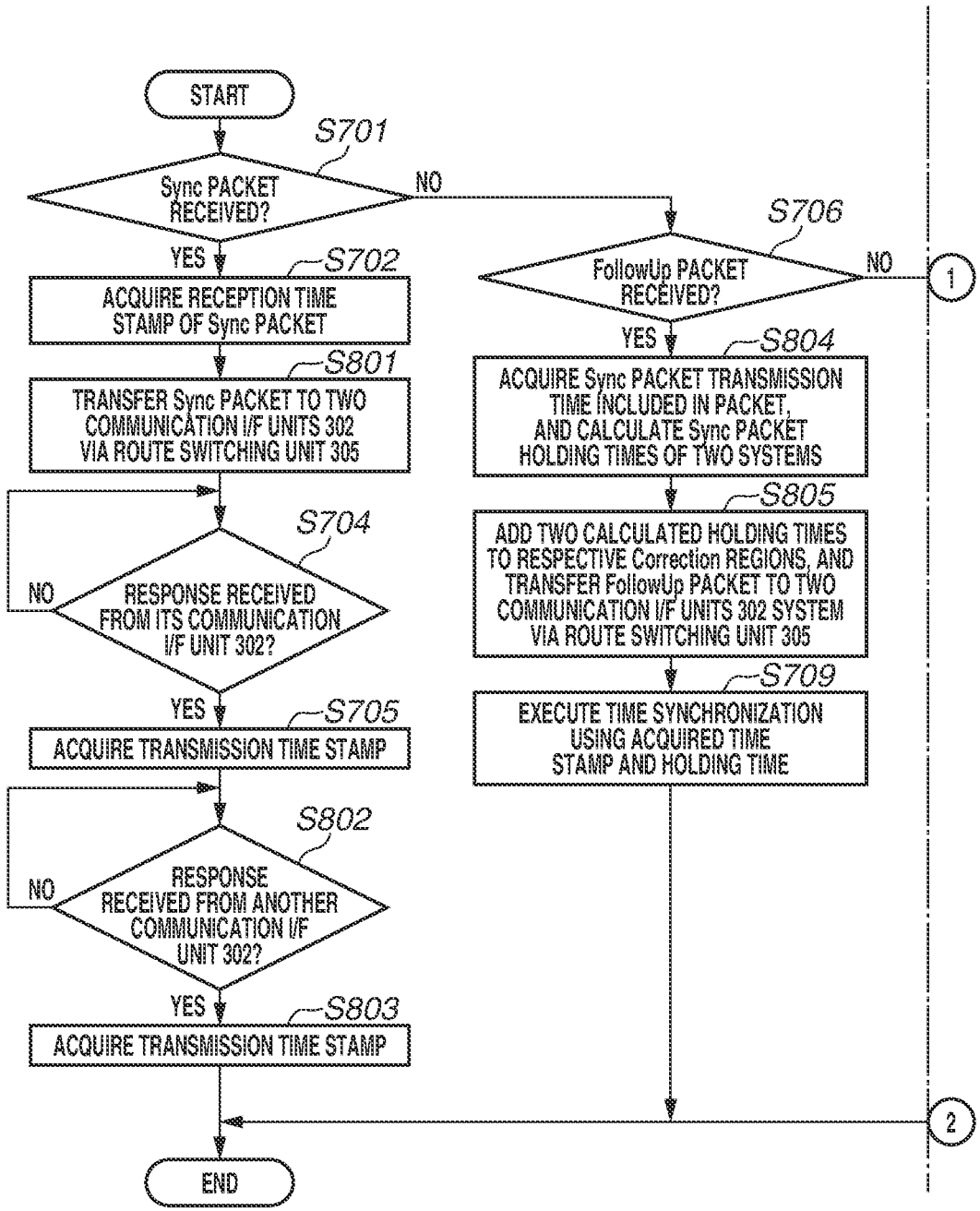
FIGS. 10A and 10B illustrate a flowchart of synchronization packet processing to be executed in an abnormal state.
Figure 10B:
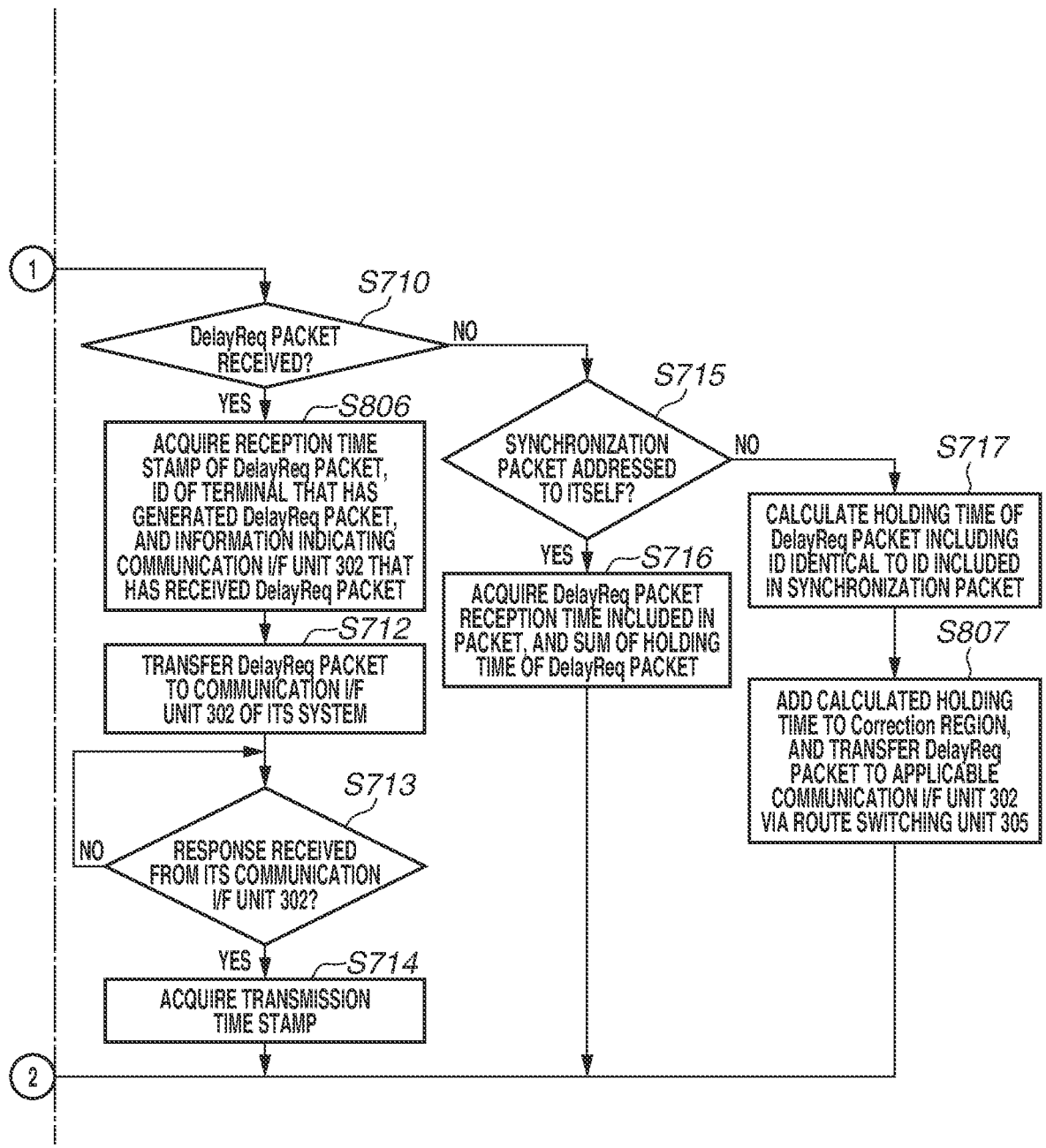

FIGS. 10A and 10B illustrate a flowchart of synchronization packet processing to be executed in an abnormal state. The same processing steps as those in the flowchart illustrated in FIGS. 9A and 9B are assigned the same step numbers, and the description will be omitted.

While a Sync packet is transferred to the communication I/F unit 302 of its system in step S703 in the synchronization packet processing in the normal state, a Sync packet is transferred, in step S801, to the communication I/F units 302c and 302d of both systems in the synchronization packet processing to be executed in the abnormal state.

While the synchronization packet processing ends after step S705 in the synchronization packet processing in the normal state, the processing proceeds to step S802 in the synchronization packet processing to be executed in the abnormal state, and a standby state is caused until a response of an error queue is received from the other communication I/F unit 302. For example, in the case of the time synchronization processing on the system 0, a response from the communication I/F unit 302d of the system 1 is awaited. Then, in a case where a response of an error queue is received (YES in step S802), the processing proceeds to step S803. In step S803, a transmission time stamp added to the error queue as auxiliary data is acquired and held. Thereafter, the synchronization packet processing ends.

In the synchronization packet processing in the normal state, in steps S707 and S708, a holding time of a Sync packet in its system is calculated, and added to a Correction region of a Follow Up packet. In contrast to this, in step S804 of the synchronization packet processing to be executed in the abnormal state, holding times of a Sync packet in the two systems are calculated from one reception time stamp and two transmission time stamps acquired in steps S702, S705, and S803. The processing proceeds to step S805. In step S805, the Follow Up packet is copied for the system 0 and for the system 1.

In step S805, a holding time obtained using the transmission time stamp acquired in step S705 is added to a Correction region of a Follow Up packet of its system, and is transferred to the communication I/F unit 302 of its system via the route switching unit 305.

In addition, in step S805, a holding time obtained using the transmission time stamp acquired in step S803 is added to a Correction region of the Follow Up packet of the other system, and transferred to the communication I/F unit 302 of the other system via the route switching unit 305.

By the above-described processing in step S805, different holding times are added to Follow Up packets respectively transmitted to the communication I/F unit 302c of the system 0 and the communication I/F unit 302d of the system 1.

In step S806 of the synchronization packet processing to be executed in the abnormal state, a reception time stamp of a Delay Req packet is acquired from the communication I/F unit 302 that has received the Delay Req packet, similarly to that in the normal state. Also in step S806, an ID of a terminal (i.e., the camera adapter 201) that has generated the Delay Req packet that is included in the received Delay Req packet is acquired, and the ID is held in association with the reception time stamp.

Unlike the normal state, in step S806, information indicating the communication I/F unit 302 that has received the Delay Req packet, out of the communication I/F unit 302 of the system 0 and the communication I/F unit 302 of the system 1 is also held in association with the reception time stamp and the ID.

That is to say, in a case where an internal route of a system in which abnormality is detected connects with an internal route of a normal system, an apparatus that has transmitted a synchronization packet and a system to which the synchronization packet has been transmitted are stored in association with each other.

In step S807, similarly to step S718 in the synchronization packet processing in the normal state, the holding time calculated in step S717 is added to a Correction region of the Delay Resp packet, and the Delay Resp packet is transferred to the communication I/F unit 302. Nevertheless, in step S807, the communication I/F unit 302 associated with the ID is used as a transmission destination communication I/F unit 302. That is, a synchronization packet addressed to the apparatus that has transmitted the synchronization packet is transmitted through a communication route of a system associated with the apparatus. By transmission destination communication I/F unit 302 being selected, network load can be reduced.

According to the camera adapter 201 of the above-described first exemplary embodiment, synchronization packet transmission is maintained in both of the system 0 and the system 1 if the occurrence points of the abnormalities are different points on the daisy chain, even in a case where abnormalities occur in both of the system 0 and the system 1. Even when abnormality occurs, accurate holding times can be obtained for both of the system 0 and the system 1. Thus, highly-accurate time synchronization is maintained in daisy-chained camera adapters 201, even in a case where abnormalities occur in both of the system 0 and the system 1.

A second exemplary embodiment will now be described. The second exemplary embodiment is similar to the first exemplary embodiment except that the functions of the camera adapter 201 are partially different. Hereinafter, the second exemplary embodiment will be described centering on a difference from the first exemplary embodiment, and redundant description will be omitted.

Figure 11:
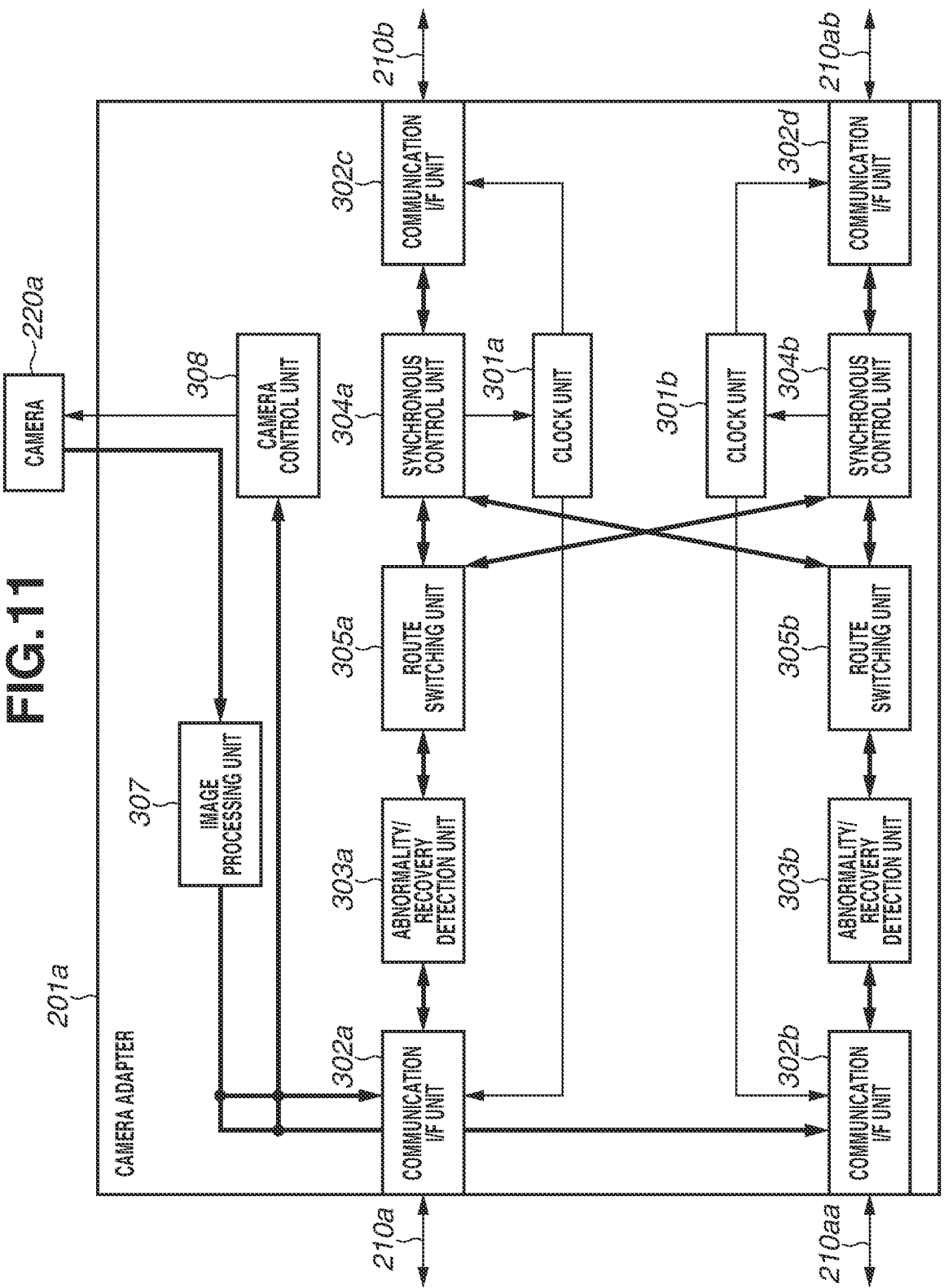
FIG. 11 is a functional block diagram illustrating functions of a camera adapter according to one or more aspects of the present disclosure.

FIG. 11 is a functional block diagram illustrating functions of a camera adapter 201 according to the second exemplary embodiment. Similarly to FIG. 4, FIG. 11 illustrates the first camera adapter 201*a* as a representative of the camera adapters 201.

In the first exemplary embodiment, the route switching units 305*a* and 305*b* are arranged between the respective synchronous control units 304*a* and 304*b*, and the respective communication I/F units 302*c* and 302*d* existing on the downstream side (i.e., a reception side for receiving a Delay Req packet) of time synchronization where only synchronization slaves exist.

In contrast to this, in the second exemplary embodiment, the route switching units 305*a* and 305*b* are arranged between the respective communication I/F units 302*a* and 302*b* existing on the upstream side (i.e., reception side for receiving a Sync packet and the like) of time synchronization where a synchronization master exists, and the synchronous control units 304*a* and 304*b*. That is to say, in the second exemplary embodiment, the route switching unit 305 controls an internal route existing on the upstream side of the synchronous control unit 304.

In the first exemplary embodiment, the synchronous control unit 304 of the system in which abnormality is detected becomes unable to receive a synchronization packet from a synchronization master if abnormality is detected on the route for the system 0 or the route for the system 1. Thus, in the first exemplary embodiment, a synchronization packet received by the synchronous control unit 304 of a normal system from the synchronization master is transferred to the communication I/F units 302 of both of the two systems via the route switching unit 305. Consequently, in the camera adapter 201 existing on the downstream side, synchronization is maintained by the synchronous control units 304 of the two systems.

In contrast to this, in the second exemplary embodiment, the synchronous control unit 304 of the system in which abnormality is detected can receive a synchronization packet from a synchronization master via the route switching unit 305 of the other system even if abnormality is detected in the route for the system 0 or the route for the system 1.

In the communication I/F unit 302 or the route switching unit 305, processing of copying a synchronization packet from a synchronization master is performed when an abnormality detection notification is received from the other system. In the second exemplary embodiment, a synchronization packet can be received also by the synchronous control unit 304 of a system in which abnormality has occurred, and thus two clock units 301 included in the camera adapter 201 can be synchronized as long as a synchronization master continues to transmit a synchronization packet. Accordingly, in the second exemplary embodiment, the clock switching unit 306 required in the first exemplary embodiment becomes unnecessary.

Time synchronization processing for implementing the above-described functions of the second exemplary embodiment will be described below.

FIG. 12 is a flowchart illustrating time synchronization processing according to the second exemplary embodiment. Nevertheless, FIG. 12 illustrates a posterior half part of the time synchronization processing. The anterior half of the time synchronization processing is the same as the processing illustrated in the flowchart in FIG. 7, and therefore the illustration is omitted. In addition, the same processing steps as those in the flowchart in FIG. 8 are assigned the same step numbers, and the description will be omitted. In steps S608 and S626 in the time synchronization processing according to the second exemplary embodiment, an Announce packet is always transferred to the communication I/F unit 302 of its system both in the normal state and the abnormal state. For example, in the case of the time synchronization processing on the route for the system 0, an Announce packet is transferred to the communication I/F unit 302*c* of the system 0 that exists on the downstream side.

In the second exemplary embodiment, the processing in step S617 is executed in a case where it is determined in step S615 that link-down has been detected and the processing proceeds to step S617 similarly to the first exemplary embodiment. Nevertheless, the processing does not proceed to step S618 because a synchronization packet and an Announce packet are delivered to the synchronous control units 304 of both systems due to the route switch.

In the second exemplary embodiment, in step S1001, synchronization packet processing is performed on a synchronization packet. The synchronization packet processing to be executed in a case where abnormality does not occur is similar to the processing according to the first exemplary embodiment that is illustrated in FIG. 9. The synchronization packet processing to be executed in a case where abnormality occurs will be described below.

In the second exemplary embodiment, route switching start processing is performed in step S1002.

The route switching start processing according to the second exemplary embodiment will be described using an example case where abnormality is detected by the abnormality/recovery detection unit 303*a* of the system 0.

If abnormality occurs on the route for the system 0, in the time synchronization processing on the route for the system 0, a synchronization packet and an Announce packet stop being delivered from the communication I/F unit 302*a* of the system 0.

In the time synchronization processing on the route for the system 1 that has received a notification indicating abnormality occurrence through the time synchronization processing on the route for the system 0, the route switching unit 305*b* of the system 1 is notified of abnormality detection, and the synchronous control units 304*a* and 304*b* of both the system 0 and the system 1 are connected to the communication I/F unit 302*b* of the system 1 by the switching of the route. A synchronization packet received by the communication I/F unit 302*b* is also duplicated.

Consequently, a synchronization packet and an Announce packet start to be delivered from the communication I/F unit 302*b* of the system 1 to the synchronous control unit 304*a* and 304*b* of both the system 0 and the system 1. A synchronization packet and the like received by the communication I/F unit 302*b* of the system 1 is transferred also to the communication I/F unit 302*c* of the system 0 via the synchronous control unit 304*b* of the system 0.

In a similar manner, in a case where abnormality is detected by the abnormality/recovery detection unit 303*b* of the system 1, a synchronization packet received by the communication I/F unit 302a of the system 0 is transmitted also to the synchronous control unit 304b of the system 1, and transferred also to the communication I/F unit 302d of the system 1.

In the second exemplary embodiment, the clock switching unit 306 is unnecessary, and thus route switching start processing in step S1002 and route switch end processing in step S632 do not include processing related to the clock switching unit 306.

Figure 13A:
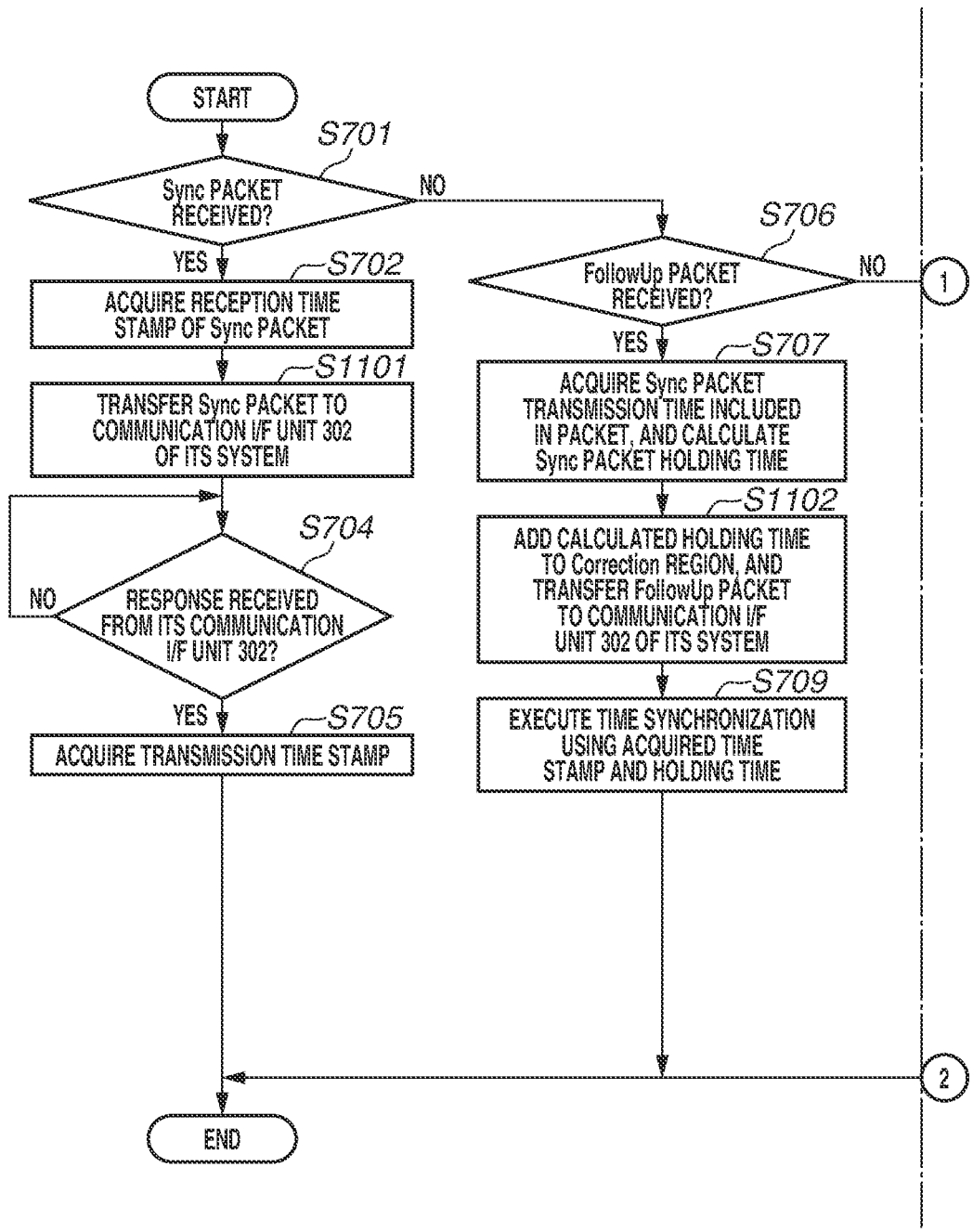
FIGS. 13A and 13B illustrate a flowchart of synchronization packet processing according to one or more aspects of the present disclosure that is to be executed in an abnormal state.
Figure 13B:
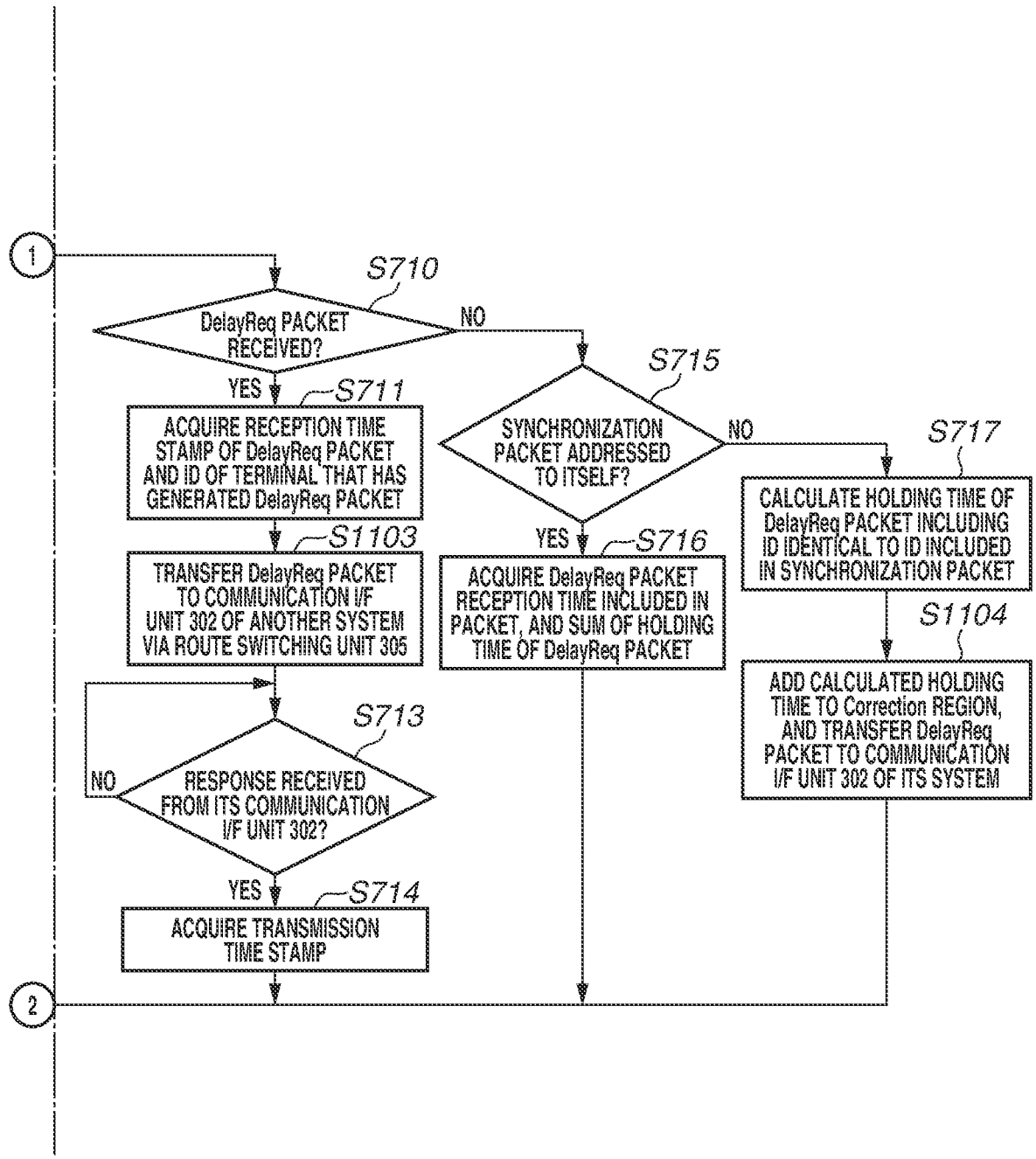

FIGS. 13A and 13B illustrate a flowchart of synchronization packet processing according to the second exemplary embodiment that is to be executed in an abnormal state. The same processing steps as those in the flowchart in FIGS. 10A and 10B are assigned the same step numbers, and the description will be omitted.

In step S1101, the received Sync packet is transferred to the communication I/F unit 302 of its system. For example, in the case of the time synchronization processing on the route for the system 0, a Sync packet is received, in step S701, from the communication I/F unit 302a of the system 0, and the Sync packet is transferred, in step S1101, to the communication I/F unit 302c of the system 0. In the second exemplary embodiment, the Sync packet is transferred not via the route switching unit 305 when the Sync packet is transferred, unlike the first exemplary embodiment.

In step S1102, the holding time calculated in step S707 is added to a Correction region of the synchronization packet, and similarly to step S1101, the synchronization packet is transferred to the communication I/F unit 302 of its system not via the route switching unit 305.

In step S1103, the received Delay Req packet is transferred to the communication I/F unit 302 of the other system via the route switching unit 305. For example, in the case of the time synchronization processing on the route for the system 0, a Delay Req packet is received, in step S710, from the communication I/F unit 302c of the system 0, and the Delay Req packet is transferred, in step S1103, to the communication I/F unit 302b of the system 1.

In step S1104, the holding time calculated in step S717 is added to a Correction region of the Delay Resp packet, and after that, the Delay Resp packet is transferred to the communication I/F unit 302 of its system not via the route switching unit 305, similarly to step S1101.

According to the camera adapter 201 according to the above-described second exemplary embodiment, synchronization packet transmission is maintained and accurate holding times are obtained in both of the system 0 and the system 1, even in a case where abnormalities occur on both of the route for the system 0 and the route for the system 1. Thus, highly-accurate time synchronization is maintained in daisy-chained camera adapters 201, even in a case where abnormalities occur on both of the route for the system 0 and the route for the system 1.

A third exemplary embodiment will now be described. The third exemplary embodiment is also similar to the first exemplary embodiment except that the functions of the camera adapter 201 are partially different. Hereinafter, the third exemplary embodiment will be described based on a difference from the first exemplary embodiment, and redundant description will be omitted.

Figure 14:
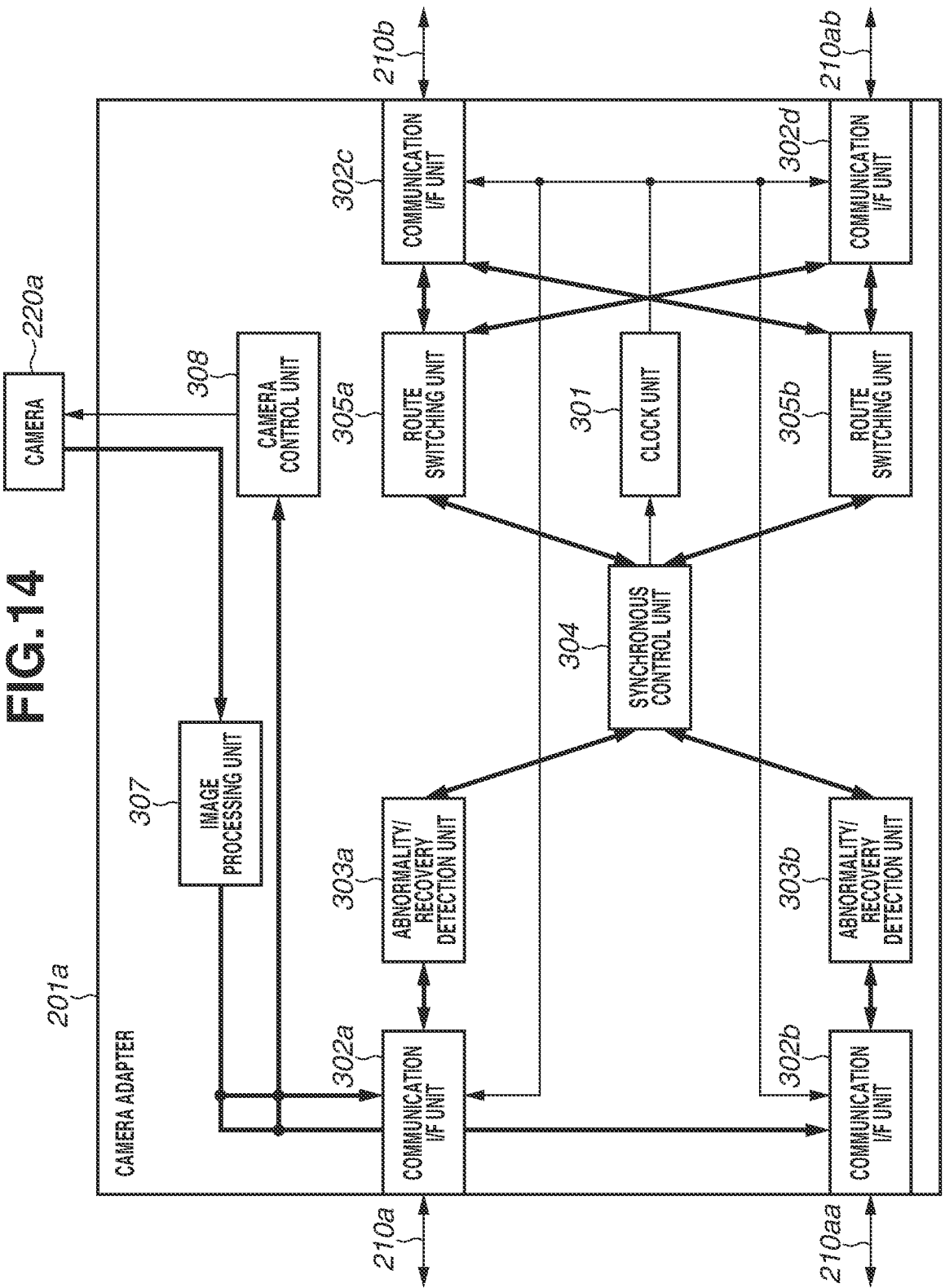
FIG. 14 is a functional block diagram illustrating functions of a camera adapter according to one or more aspects of the present disclosure.

FIG. 14 is a functional block diagram illustrating functions of a camera adapter 201 according to the third exemplary embodiment. Similarly to FIG. 4, FIG. 14 illustrates the first camera adapter 201a as a representative of the camera adapters 201.

In the first and second exemplary embodiments, two synchronous control units 304a and 304b are included for two synchronization routes in the camera adapter 201, but in the third exemplary embodiment, one synchronous control unit 304 to be used in common for two synchronization routes in the camera adapter 201 is included.

Because only one synchronous control unit 304 is included in the third exemplary embodiment, only one clock unit 301 is included. That is to say, only one set of the synchronous control unit 304 and the clock unit 301 that are to be used in common for internal routes of a plurality of systems are included.

Similarly to the first and second exemplary embodiments, also in the third exemplary embodiment, among four communication I/F units 302, two communication I/F units 302a and 302c are paired as the system 0 to be used when a synchronization packet is transferred, and the other two communication I/F units 302b and 302d are paired as the system 1.

In the third exemplary embodiment, only one clock unit 301 is included, and thus time synchronization is performed using time information of either one of synchronization packets of the system 0 and the system 1. Alternatively, both time information pieces of the two systems can be used in time synchronization by using statistical processing such as an average value or a median value of time information pieces of the two systems.

Time synchronization processing to be executed by the camera adapter 201 according to the third exemplary embodiment will now be described.

Figure 15:
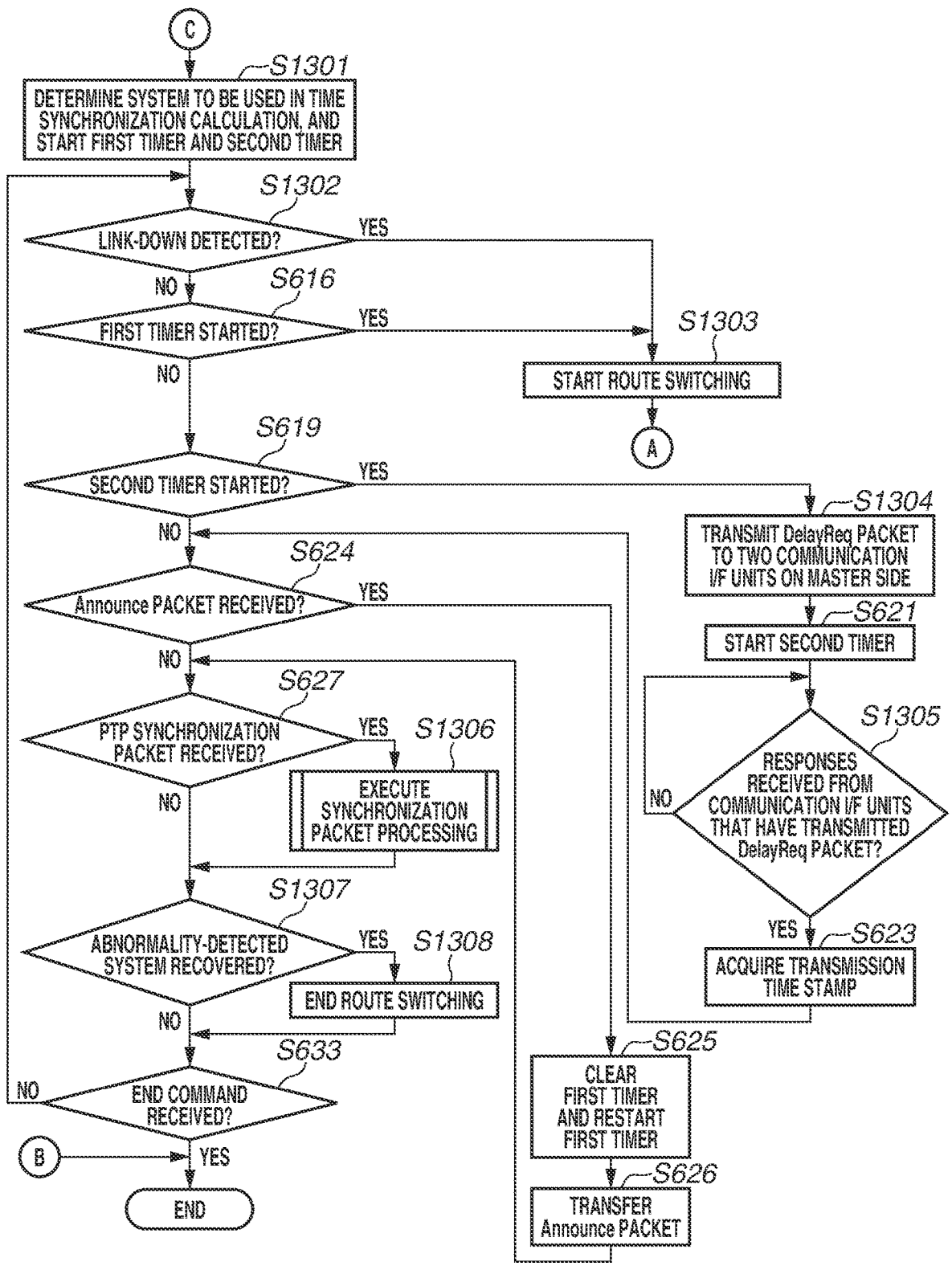
FIG. 15 is a flowchart illustrating time synchronization processing according to one or more aspects of the present disclosure.

FIG. 15 is a flowchart illustrating time synchronization processing according to the third exemplary embodiment. Nevertheless, FIG. 15 illustrates a posterior half part of the time synchronization processing. The anterior half of the time synchronization processing is the same as the processing illustrated in the flowchart in FIG. 7, and thus the illustration is omitted. The same processing steps as those in the flowchart in FIG. 8 are assigned the same step numbers, and the description will be omitted.

In the third exemplary embodiment, only a single piece of time synchronization processing is operated by one camera adapter 201. That is, both of the time synchronization processing on the route for the system 0, and the time synchronization processing on the route for the system 1 are executed by a processing flow illustrated in the flowchart in FIG. 15.

In step S1301 in the time synchronization processing according to the third exemplary embodiment, a system to be used in the calculation in time synchronization is determined because a synchronization master has been determined in step S611. The first timer and the second timer are then started, and the processing proceeds to step S1302.

In step S1302, it is determined whether link-down has been detected in either the system 0 or the system 1.

In a case where it is determined in step S1302 that link-down has been detected (YES in step S1302), or in a case where it is determined in step S616 that the first timer has been started (YES in step S616), the processing proceeds to step S1303. In step S1303, the route switching processing is started.

The route switching start processing in step S1303 will now be described.

If abnormality occurs, either one of the communication I/F units 302a and 302b of the system 0 and the system 1 enters a state of being unable to communicate with a synchronization master. Thus, in the route switching start processing in step S1303, an internal route is switched by the route switching unit 305, and similarly to the first exemplary embodiment, an internal route of a normal system is connected to both the communication I/F units 302c and 302d of the two systems.

That is to say, in a case where abnormality is detected by the abnormality/recovery detection unit 303a of the system 0, a synchronization packet received by the communication I/F unit 302a of the system 0 is also transferred to the communication I/F unit 302d of the system 1. In a case where abnormality is detected by the abnormality/recovery detection unit 303b of the system 1, a synchronization packet received by the communication I/F unit 302b of the system 1 is transferred also to the communication I/F unit 302c of the system 0.

In the third exemplary embodiment, in step S1304, a Delay Req packet is transmitted to a synchronization master from the communication I/F unit 302 existing on the upstream side. In the first exemplary embodiment, in the transmission of the Delay Req packet, the communication I/F unit 302a of the system 0 is used when the time synchronization processing is executed on the route for the system 0, and the communication I/F unit 302b of the system 1 is used when the time synchronization processing is executed on the route for the system 1. In contrast to this, in step S1304 of the third exemplary embodiment, both the communication I/F units 302a and 302b of the system 0 and the system 1 are used in the transmission of the Delay Req packet.

In step S1305 of the third exemplary embodiment, a standby state is caused until responses of error queues are received from the communication I/F units 302 of the system 0 and the system 1, and in a case where the responses have been received (YES in step S1305), the processing proceeds to step S623. In step S623, transmission time stamps added to the error queues are auxiliary data are acquired and held for both of the system 0 and the system 1.

In step S1306 of the third exemplary embodiment, synchronization packet processing is performed on the received synchronization packet. The details of the synchronization packet processing will be described below.

In step S1307, it is determined whether an abnormality-detected system out of the system 0 and the system 1 has recovered to a normal state. In a case where the system has recovered to a normal state (YES in step S1307), the processing proceeds to step S1308. In step S1308, route switching end processing is performed. In a case where the system has not recovered to a normal state (NO in step S1307), the processing in step S1308 is skipped. In the route switching end processing in step S1308, the route switching unit 305 returns the connection of internal routes to the connection in the normal state.

That is, the communication I/F units 302a and 302c of the system 0 that exist on the upstream side and the downstream side are paired when a synchronization packet is transferred, and the communication I/F units 302b and 302d of the system 1 that exist on the upstream side and the downstream side are paired when a synchronization packet is transferred.

Figure 16:
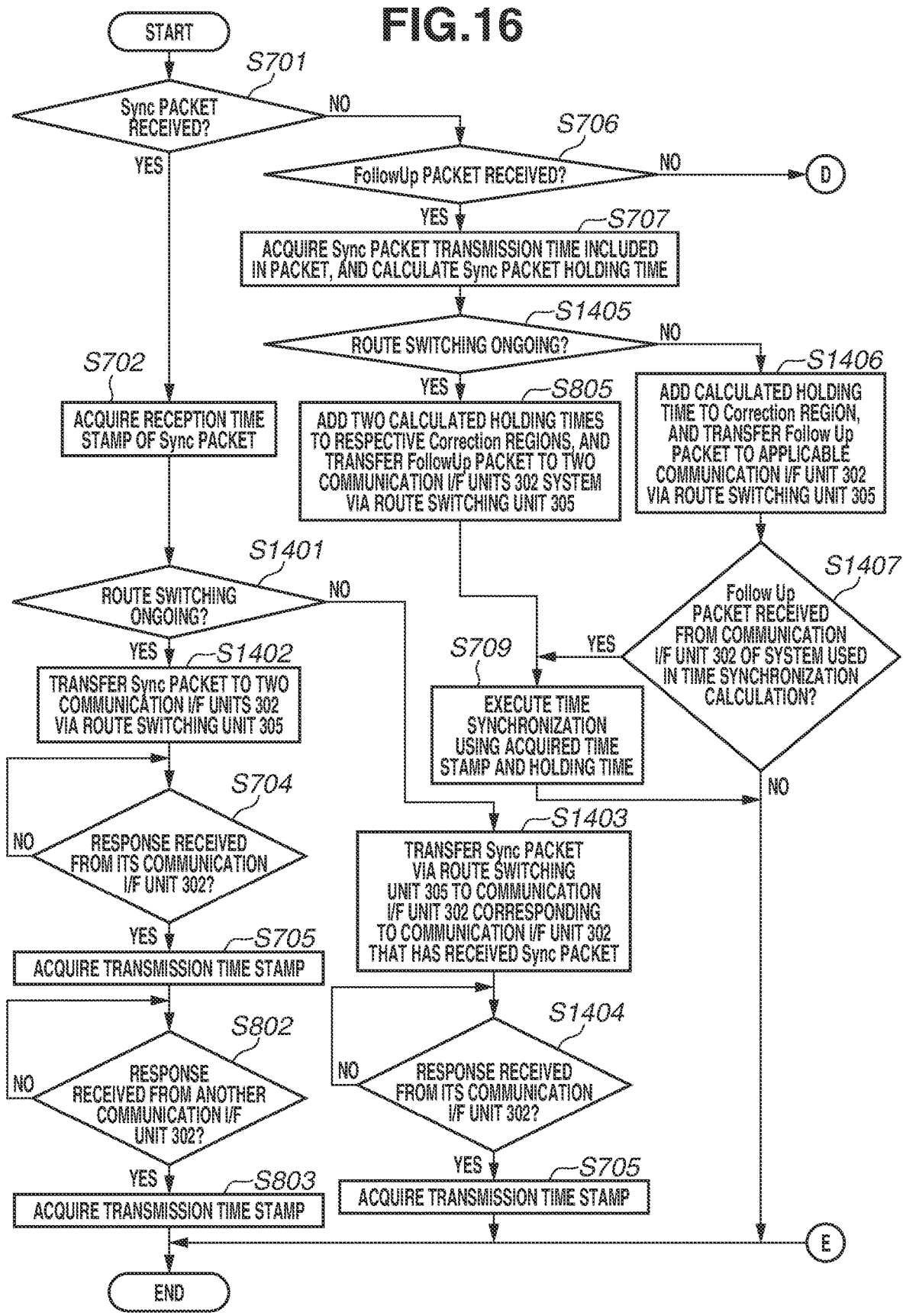
FIG. 16 is a flowchart illustrating an anterior half part of synchronization packet processing according to one or more aspects of the present disclosure.
Figure 17:
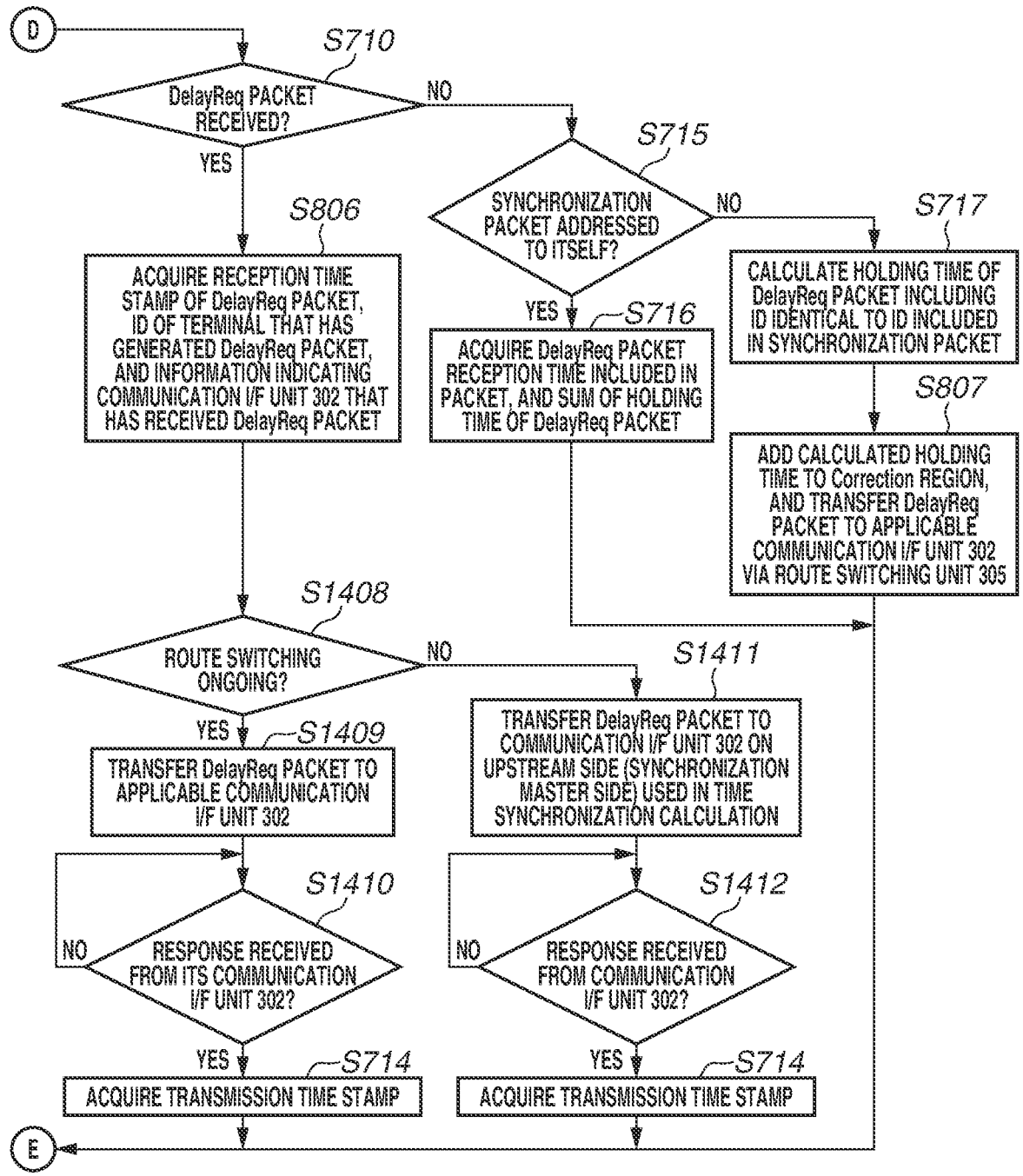
FIG. 17 is a flowchart illustrating a posterior half part of the synchronization packet processing according to one or more aspects of the present disclosure.

FIGS. 16 and 17 are flowcharts illustrating synchronization packet processing according to the third exemplary embodiment. Points indicated by D and E illustrated in FIG. 16 respectively connect to points indicated by D and E illustrated in FIG. 17. The same processing steps as those in the flowcharts in FIGS. 9 and 10 are assigned the same step numbers, and the description will be omitted.

In step S1401, it is determined whether route switching is ongoing (i.e., whether abnormality has occurred). In a case where route switching is ongoing (YES in step S1401), the processing proceeds to step S1402. In step S1402, a Sync packet is transferred to the communication I/F units 302c and 302d of the two systems via the route switching unit 305.

In contrast, in a case where route switching is not ongoing (NO in step S1401), the processing proceeds to step S1403. In step S1403, a Sync packet is transferred via the route switching unit 305 to the communication I/F unit 302 of the same system as the communication I/F unit 302 that has received the Sync packet. That is, a Sync packet received by the communication I/F unit 302a of the system 0 is transferred to the communication I/F unit 302c of the system 0, and a Sync packet received by the communication I/F unit 302b of the system 1 is transferred to the communication I/F unit 302d of the system 1.

After that, in step S1404, a standby state is caused until a response of an error queue is received from the communication I/F unit 302 used in step S1403 for transfer. If the response has been received (YES in step S1404), the processing proceeds to step S705.

In the third exemplary embodiment, in step S1405, it is also determined whether route switching is ongoing (i.e., whether abnormality has occurred). In a case where route switching is ongoing (YES in step S1405), the processing proceeds to step S805. In contrast, in a case where route switching is not ongoing (NO in step S1405), the processing proceeds to step S1406. In step S1406, the holding time calculated in step S707 is added to a Correction region of the Follow Up packet.

The Follow Up packet is transferred via the route switching unit 305 to the communication I/F unit 302 of a corresponding system. That is, a Follow Up packet received by the communication I/F unit 302a of the system 0 is transferred to the communication I/F unit 302c of the system 0. In addition, a Follow Up packet received by the communication I/F unit 302b of the system 1 is transferred to the communication I/F unit 302d of the system 1.

After the Follow Up packet is transferred, it is determined, in step S1407, whether the Follow Up packet has been received from the communication I/F unit 302 of a system to be used in time synchronization calculation (i.e., system determined in step S1301). In a case where the Follow Up packet has been received from the communication I/F unit 302 of the system to be used in time synchronization calculation (YES in step S1407), the processing proceeds to step S709. In step S709, time synchronization is executed. In a case where the Follow Up packet has been received from the communication I/F unit 302 of the system not to be used in time synchronization calculation (NO in step S1407), the synchronization packet processing is ended.

In the third exemplary embodiment, in step S1408, it is also determined whether route switching is ongoing (i.e., whether abnormality has occurred). In a case where route switching is not ongoing (NO in step S1408), the processing proceeds to step S1409. In step S1409, a Delay Req packet is transferred to the communication I/F unit 302 of a corresponding system, and the processing proceeds to step S1410. In step S1410, a standby state is caused until a response of an error queue is received from the communication I/F unit 302 that has been used for transfer. If the response has been received (YES in step S1410), the processing proceeds to step S714.

In a case where it is determined in step S1408 described above that route switching is ongoing (YES in step S1408), the processing proceeds to step S1411. In step S1411, a Delay Req packet is transferred to the communication I/F unit 302 existing on the synchronization master side (i.e., upstream side) of the system to be used in time synchronization calculation. Thereafter, the processing proceeds to step S1412. In step S1412, a standby state is caused until a response of an error queue is received from the communication I/F unit 302 that has been used for transfer. If the response has been received (YES in step S1412), the processing proceeds to step S714.

According to the camera adapter 201 of the above-described third exemplary embodiment, synchronization packet transmission is maintained and accurate holding times are obtained in both the system 0 and the system 1, even in a case where abnormalities occur on both the route for the system 0 and the route for the system 1. Thus, highly-accurate time synchronization is maintained in daisy-chained camera adapters 201, even in a case where abnormalities occur on both the route for the system 0 and the route for the system 1.

The present disclosure can employ exemplary embodiments as a system, an apparatus, a method, a program, or a recording medium (storage medium), for example. Specifically, the present disclosure can be applied to a system including a plurality of devices (e.g., host computer, interface device, and Web application,), or can be applied to a system including a single device.

Other Embodiments

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2022-137746, filed Aug. 31, 2022, which is hereby incorporated by reference herein in its entirety.

What is claimed is:

1. A synchronous control apparatus comprising:
an internal clock;
a plurality of internal routes that are internal routes through which a synchronization packet passes as a part of a communication route and a transmission or reception time of the synchronization packet is acquired from the internal clock, and are internal routes provided in such a manner as to correspond to communication routes of a plurality of systems that are independent of each other;
a synchronous control unit configured to synchronize the internal clock using the synchronization packet;
a detection unit configured to detect abnormality of the communication route;
a route control unit configured to, in a case where abnormality of the communication route has been detected, connect an internal route of a system in which abnormality has been detected to an internal route of a normal system; and
a holding calculation unit configured to calculate a holding time of a synchronization packet that is based on the transmission or reception time, for each route through which a synchronization packet passes, and add the holding time to a synchronization packet that passes through a same route as a route for which the holding time has been calculated.

2. The synchronous control apparatus according to claim 1,
wherein the synchronous control unit is positioned at a midpoint on the internal route, and synchronizes the internal clock using a synchronization packet transmitted from an upstream side of the communication route, and
wherein the route control unit controls an internal route existing on a downstream side of the synchronous control unit.

3. The synchronous control apparatus according to claim 2,
wherein the synchronous control units and the internal clocks are respectively included for the plurality of systems, and
wherein a time is provided from an internal clock of a normal system to an internal route of a system in which abnormality of the communication route has been detected.

4. The synchronous control apparatus according to claim 1,
wherein the synchronous control unit is positioned at a midpoint on the internal route, and synchronizes the internal clock using a synchronization packet transmitted from an upstream side of the communication route, and
wherein the route control unit controls an internal route existing on an upstream side of the synchronous control unit.

5. The synchronous control apparatus according to claim 1, wherein one common set of the synchronous control unit and the internal clock is included for internal routes of the plurality of systems.

6. The synchronous control apparatus according to claim 1, wherein, in a case where an internal route of a system in which abnormality has been detected connects with an internal route of a normal system, an apparatus that has transmitted the synchronization packet and a system to which the synchronization packet has been transmitted are stored in association with each other, and a synchronization packet addressed to the apparatus is transmitted on a communication route of a system associated with the apparatus.

7. A synchronous imaging apparatus comprising:
the synchronous control apparatus according to claim 1; and
an imaging unit configured to execute image capturing in synchronization with the internal clock.

8. A synchronous control method of a synchronous control apparatus including an internal clock, a plurality of internal routes that are internal routes through which a synchronization packet passes as a part of a communication route, and a transmission or reception time of the synchronization packet is acquired from the internal clock, and are internal routes provided in such a manner as to correspond to communication routes of a plurality of systems that are independent of each other, a synchronous control unit configured to synchronize the internal clock using the synchronization packet, and a detection unit configured to detect abnormality of the communication route, the synchronous control method comprising:
  in a case where abnormality of the communication route has been detected, connecting an internal route of a system in which abnormality has been detected, to an internal route of a normal system; and
  calculating a holding time of a synchronization packet that is based on the transmission or reception time, for each route through which a synchronization packet passes, and adding the holding time to a synchronization packet that passes through a same route as a route for which the holding time has been calculated.

9. A non-transitory storage medium storing a program causing a synchronous control apparatus including an internal clock, a plurality of internal routes that are internal routes through which a synchronization packet passes as a part of a communication route, and a transmission or reception time of the synchronization packet is acquired from the internal clock, and are internal routes provided in such a manner as to correspond to communication routes of a plurality of systems that are independent of each other, a synchronous control unit configured to synchronize the internal clock using the synchronization packet, and a detection unit configured to detect abnormality of the communication route, to execute a control method, the control method comprising:
  in a case where abnormality of the communication route has been detected, connecting an internal route of a system in which abnormality has been detected, to an internal route of a normal system; and
  calculating a holding time of a synchronization packet that is based on the transmission or reception time, for each route through which a synchronization packet passes, and adding the holding time to a synchronization packet that passes through a same route as a route for which the holding time has been calculated.

* * * * *